United States Patent
Pyo et al.

(10) Patent No.: US 8,633,104 B2
(45) Date of Patent: Jan. 21, 2014

(54) METHODS OF MANUFACTURING THREE-DIMENSIONAL SEMICONDUCTOR DEVICES

(75) Inventors: Myungjung Pyo, Hwaseong-si (KR); Hyo-Jung Kim, Seoul (KR); JongHeun Lim, Hwaseong-si (KR); Kyunghyun Kim, Seoul (KR); Byoungmoon Yoon, Suwon-si (KR); JaHyung Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 6 days.

(21) Appl. No.: 13/545,535

(22) Filed: Jul. 10, 2012

(65) Prior Publication Data

US 2013/0017629 A1    Jan. 17, 2013

(30) Foreign Application Priority Data

Jul. 11, 2011 (KR) .................. 10-2011-0068507

(51) Int. Cl.
*H01L 21/8247* (2006.01)

(52) U.S. Cl.
USPC ........... 438/618; 438/637; 438/694; 438/740; 438/588; 438/598; 257/329; 257/E29.309; 257/315; 257/324

(58) Field of Classification Search
USPC .......... 257/329, E29.309, 315, 324; 438/618, 438/156, 588, 598, 396, 198, 264, 637, 694, 438/740
See application file for complete search history.

(56) References Cited

U.S. PATENT DOCUMENTS

| | | | |
|---|---|---|---|
| 7,952,136 B2 | 5/2011 | Kito et al. | |
| 7,972,955 B2* | 7/2011 | Choi et al. | 438/618 |
| 8,309,405 B2* | 11/2012 | Yang et al. | 438/156 |
| 8,377,817 B2* | 2/2013 | Park et al. | 438/618 |
| 8,530,959 B2* | 9/2013 | Chang et al. | 257/329 |
| 2008/0253183 A1 | 10/2008 | Mizukami et al. | |
| 2010/0096682 A1 | 4/2010 | Fukuzumi et al. | |
| 2011/0092038 A1* | 4/2011 | Choi et al. | 438/268 |
| 2011/0189853 A1 | 8/2011 | Kito et al. | |
| 2011/0199804 A1* | 8/2011 | Son et al. | 365/51 |
| 2011/0204421 A1* | 8/2011 | Choi et al. | 257/211 |
| 2011/0233648 A1* | 9/2011 | Seol et al. | 257/324 |

(Continued)

FOREIGN PATENT DOCUMENTS

| | | |
|---|---|---|
| JP | 2010-098235 A | 4/2010 |
| KR | 100938514 B1 | 1/2010 |

(Continued)

*Primary Examiner* — Telly Green
(74) *Attorney, Agent, or Firm* — Harness, Dickey & Pierce, P.L.C.

(57) ABSTRACT

According to example embodiments, a methods includes forming a peripheral structure including peripheral circuits on a peripheral circuits region of a substrate, recessing a cell array region of the substrate to form a concave region having a bottom surface lower than a top surface of the peripheral structure, forming a stacked layer structure conformally covering the concave region, the stacked layer structure including a plurality of layers sequentially stacked and having a lowest top surface in the cell array region and a highest top surface in the peripheral circuits region, forming a planarization stop layer that conformally covers the stacked layer structure, and planarizing the stacked layer structure using the planarization stop layer in the cell array region as a planarization end point to expose top surfaces of the thin layers between the cell array region and the peripheral circuits region simultaneously with a top surface of the peripheral structure.

20 Claims, 30 Drawing Sheets

(56) References Cited

U.S. PATENT DOCUMENTS

| | | | |
|---|---|---|---|
| 2012/0001345 A1* | 1/2012 | Park et al. | 257/774 |
| 2012/0032245 A1* | 2/2012 | Hwang et al. | 257/314 |
| 2012/0043673 A1* | 2/2012 | Chang et al. | 257/786 |
| 2012/0049268 A1* | 3/2012 | Chang et al. | 257/324 |
| 2012/0064682 A1* | 3/2012 | Jang et al. | 438/268 |
| 2012/0068247 A1* | 3/2012 | Lee et al. | 257/316 |
| 2012/0068259 A1* | 3/2012 | Park et al. | 257/329 |
| 2012/0070944 A1* | 3/2012 | Kim et al. | 438/128 |
| 2012/0083077 A1* | 4/2012 | Yang et al. | 438/156 |
| 2012/0086072 A1* | 4/2012 | Yun et al. | 257/329 |
| 2012/0108048 A1* | 5/2012 | Lim et al. | 438/586 |
| 2012/0112260 A1* | 5/2012 | Kim et al. | 257/315 |
| 2012/0153372 A1* | 6/2012 | Kim et al. | 257/314 |
| 2012/0171861 A1* | 7/2012 | Park et al. | 438/639 |
| 2012/0208347 A1* | 8/2012 | Hwang et al. | 438/430 |
| 2012/0295409 A1* | 11/2012 | Yun et al. | 438/268 |
| 2013/0065369 A1* | 3/2013 | Yang et al. | 438/268 |
| 2013/0140623 A1* | 6/2013 | Lee et al. | 257/324 |
| 2013/0146961 A1* | 6/2013 | Park et al. | 257/314 |

FOREIGN PATENT DOCUMENTS

| | | |
|---|---|---|
| KR | 100975681 B1 | 8/2010 |
| KR | 20100096682 A | 9/2010 |
| KR | 100989231 B1 | 10/2010 |

* cited by examiner

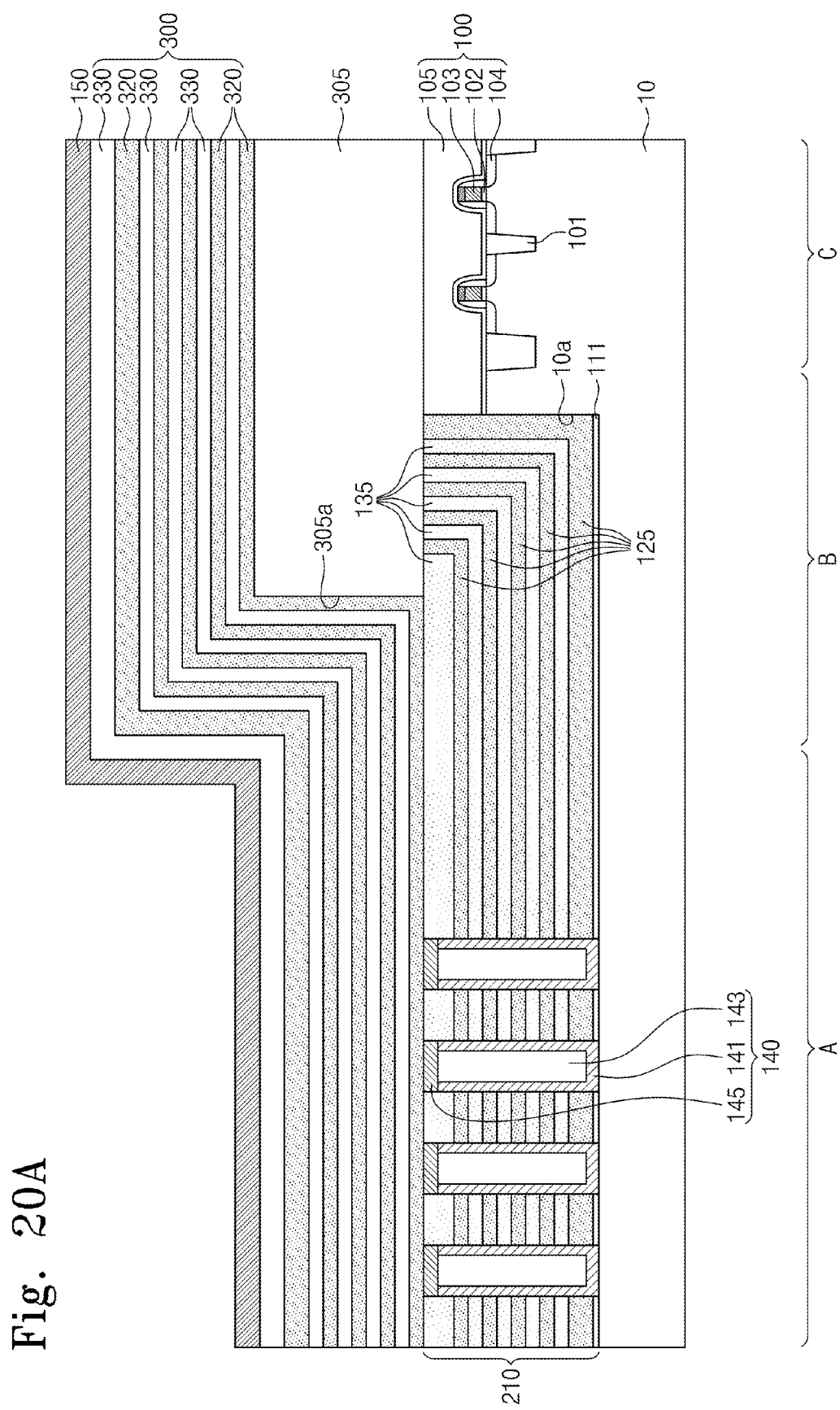

METHODS OF MANUFACTURING THREE-DIMENSIONAL SEMICONDUCTOR DEVICES

CROSS-REFERENCE TO RELATED APPLICATIONS

This U.S. non-provisional patent application claims priority under 35 U.S.C. §119 to Korean Patent Application No. 10-2011-0068507, filed on Jul. 11, 2011, the entirety of which is incorporated by reference herein.

BACKGROUND

Example embodiments of inventive concept relate to a method of manufacturing a semiconductor devices and, more particularly, to methods of manufacturing a three-dimensional semiconductor devices.

Higher integration of semiconductor devices is desired to satisfy consumer demands for performance and prices for electronic devices. Since the integration of semiconductor devices is important in determining product price, increased integration is desired. The integration level of typical two-dimensional or planar semiconductor memory devices may be determined by the area occupied by a unit memory cell. Accordingly, in such devices, integration may be influenced by the level of fine pattern forming technology used in their manufacture. However, expensive processing equipment may be needed to increase pattern fineness and may set a practical limitation on increasing integration for two-dimensional or planar semiconductor devices.

Three-dimensional semiconductor memory devices having three-dimensionally arranged memory cells have been proposed. However, in order to mass produce three-dimensional semiconductor memory devices, new process technologies should be developed.

SUMMARY

Example embodiments of inventive concepts relate to methods of manufacturing three-dimensional semiconductor devices.

According to example embodiments, a method of manufacturing a three-dimensional semiconductor device includes forming a peripheral structure including peripheral circuits on a peripheral circuits region of a substrate, recessing a cell array region of the substrate to form a concave region having a bottom surface lower than a top surface of the peripheral structure, forming a stacked layer structure conformally covering the substrate in which the concave region is formed, the stacked layer structure including a plurality of thin layers sequentially stacked, and the stacked layer structure having a lowest top surface in the cell array region and a highest top surface in the peripheral circuits region, forming a planarization stop layer conformally covering the stacked layer structure, and planarizing the stacked layer structure using the planarization stop layer in the cell array region as a planarization end point to expose top surfaces of the thin layers between the cell array region and the peripheral circuits region simultaneously with a top surface of the peripheral structure.

According to example embodiments, a method of manufacturing a three-dimensional semiconductor device includes forming a concave region in a substrate including a cell array region and a peripheral circuits region, the concave region having a bottom surface parallel to a top surface of the substrate and a sidewall between the cell array region and the peripheral circuits region, forming a stacked layer structure conformally covering the bottom surface and the sidewall of the concave region, the stacked layer structure including a plurality of thin layers sequentially stacked and the stacked layer structure having a lowest top surface in the cell array region and a highest top surface in the peripheral circuits region, forming a planarization stop layer conformally covering the stacked layer structure, and planarizing the stacked layer structure using the planarization stop layer in the cell array region as a planarization end point to expose top surfaces of the thin layers between the cell array region and the peripheral circuits region simultaneously with a top surface of the peripheral structure.

According to example embodiments, a method of manufacturing a three-dimensional semiconductor device includes forming a stacked layer structure that conformally covers at least a first and a second surface of a substrate and at least part of a peripheral structure on a peripheral circuits region of a substrate, forming a planarization stop layer that conformally covers the stacked layer structure, and planarizing the stacked layer structure. The second surface of the substrate may define a sidewall between the first surface of the substrate and a top surface of the peripheral circuits region of the substrate. The stacked layer structure may include a plurality of layers sequentially stacked. The stacked layer structure may have a top surface over the first surface of the substrate that is lower compared to a top surface of the stacked layer structure over the peripheral structure. The planarizing the stacked layer structure may use at least part of the planarization stop layer as a planarization end point and expose top surface of segments of the thin layers extending parallel to the second surface of the substrate.

BRIEF DESCRIPTION OF THE DRAWINGS

Example embodiments of inventive concepts will become more clearly understood from the following brief description taken in conjunction with the accompanying drawings, in which:

FIGS. 20A through 20F are cross-sectional views illustrating a method of manufacturing a 3D semiconductor device according to example embodiments of inventive concepts;

Figure 1:
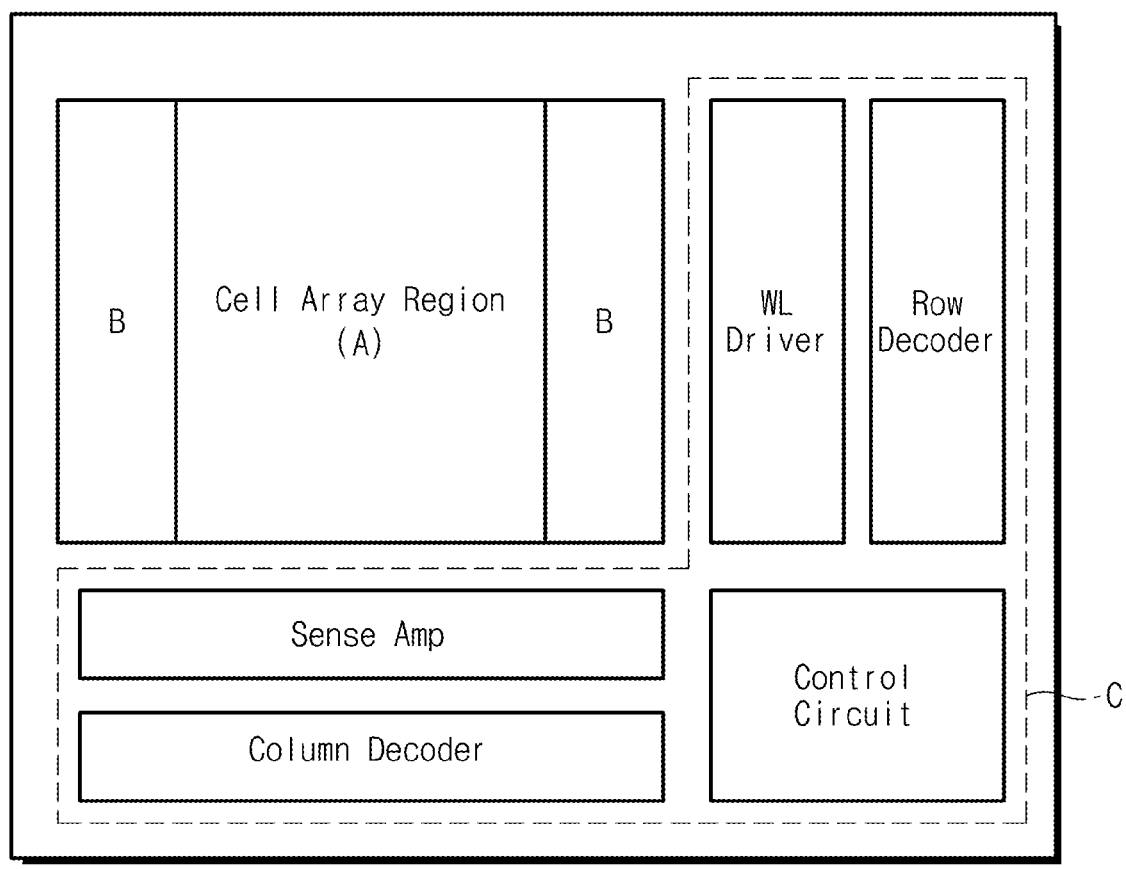
FIG. 1 is a schematic block diagram illustrating a three-dimensional (3D) semiconductor device according to example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of like reference numbers in the various drawings is intended to indicate the presence of like elements or features throughout the different views.

DETAILED DESCRIPTION OF THE EMBODIMENTS

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of inventive concepts. As used herein, the singular terms "a," "an" and "the" are intended to include the plural forms as well, unless the context clearly indicates otherwise. As used herein, the term "and/or" includes any and all combinations of one or more of the associated listed items.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It will be also understood that although the terms first, second, third etc. may be used herein to describe various elements, these elements should not be limited by these terms. These terms are only used to distinguish one element from another element. Thus, a first element could be termed a second element without departing from the teachings of example embodiments of inventive concepts. Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic block diagram illustrating a three-dimensional (3D) semiconductor device according to example embodiments of inventive concepts.

Referring to FIG. 1, a 3D semiconductor device according to example embodiments of inventive concepts may include a cell array region A, a connection region B, and a peripheral circuits region C.

Memory cells being three-dimensionally arranged, and bit lines and word lines electrically connected to the memory cells may be formed in the cell array region A. The connection region B may be disposed between the cell array region A and the peripheral circuits region C. Contact plugs and wires connecting the memory cells to peripheral circuits may be formed in the connection region B. The peripheral circuits for driving the memory cells and for sensing data stored in the memory cells may be formed in the peripheral circuits region C. In more detail, a word line driver, a sense amplifier, row and column decoders, and control circuits may be formed in the peripheral circuits region C.

Figure 2:
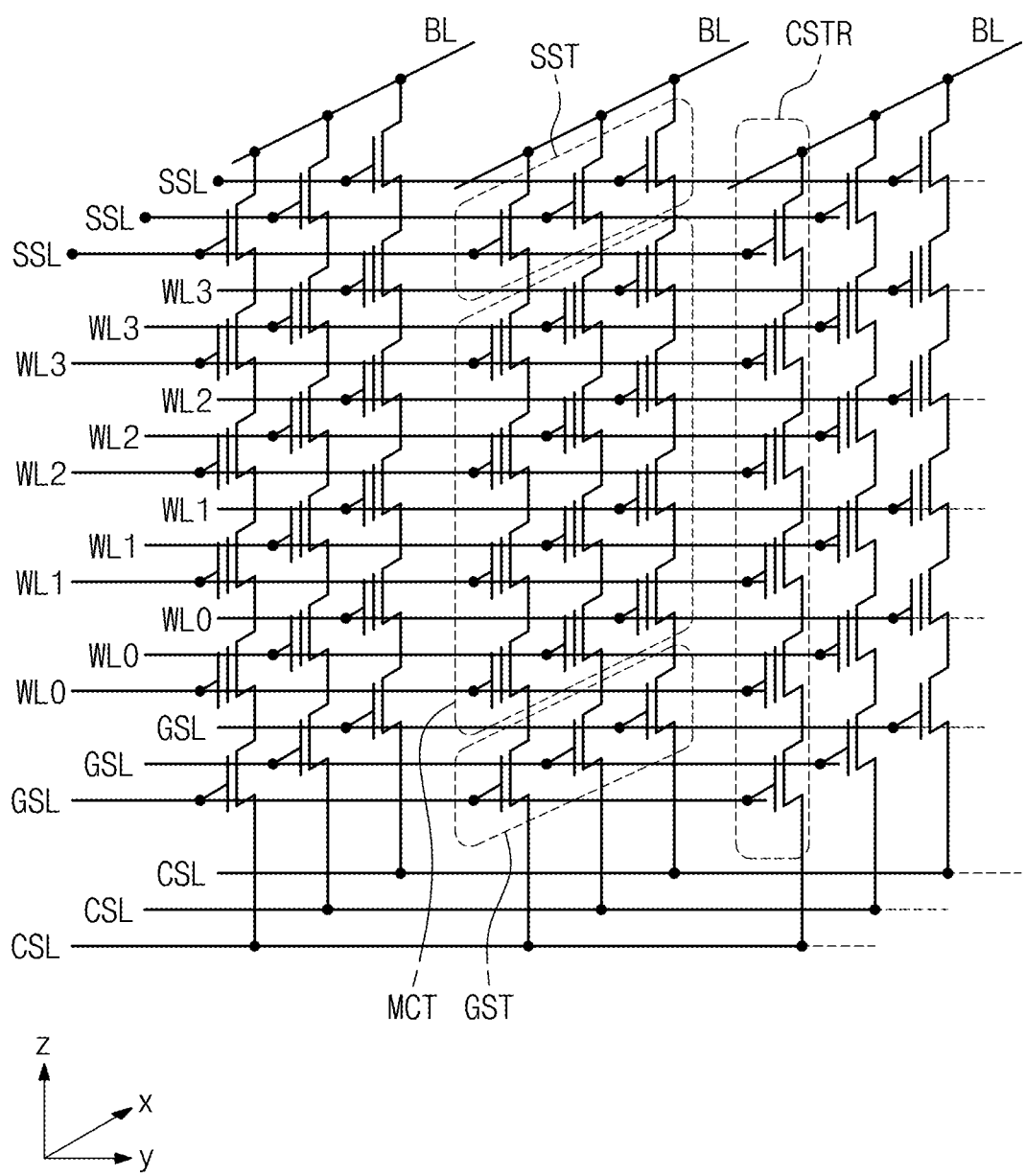
FIG. 2 is a circuit diagram illustrating a cell array of a 3D semiconductor device according to example embodiments of inventive concepts.
Figure 3:
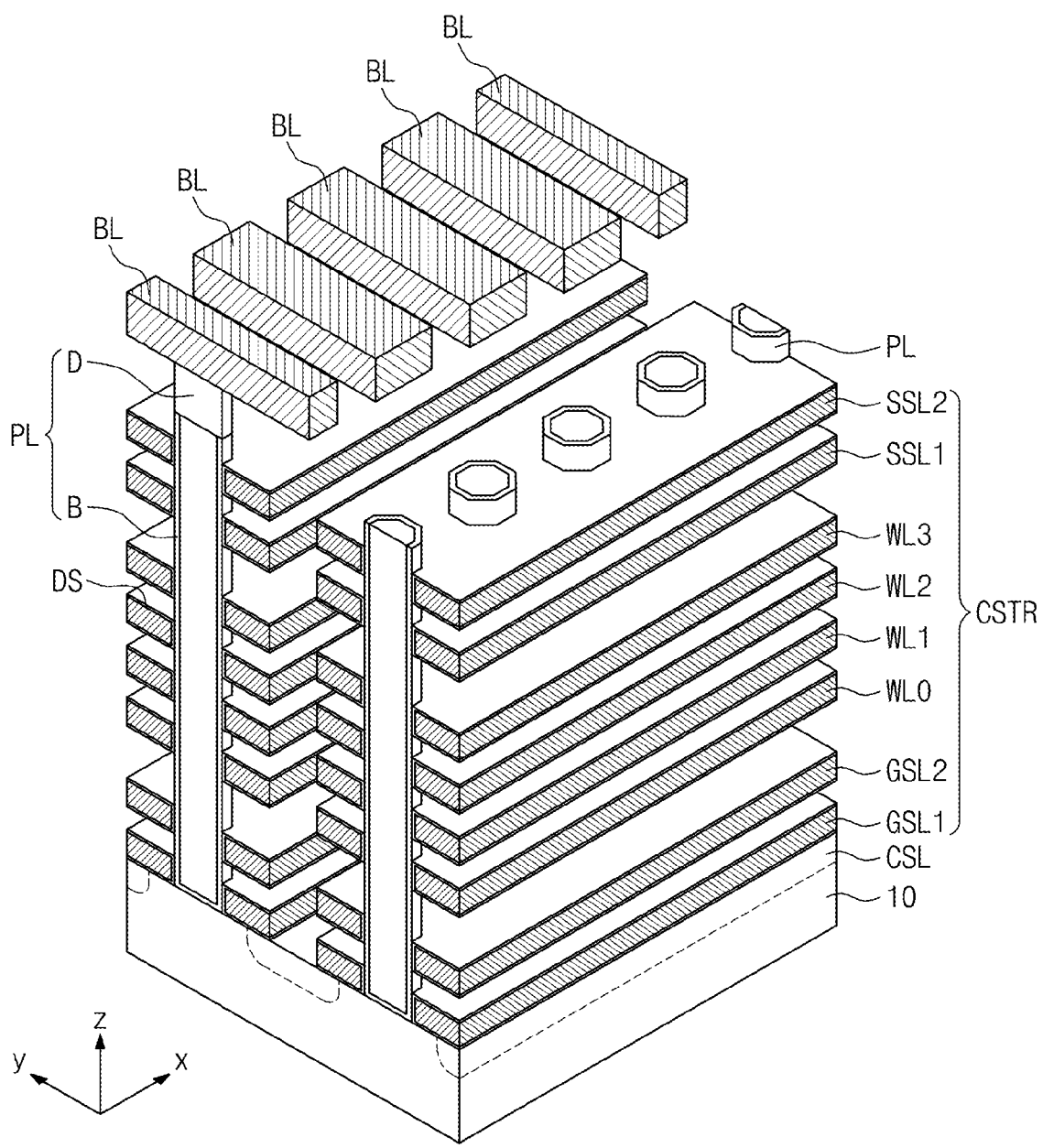
FIG. 3 is a perspective view illustrating a cell array of a 3D semiconductor device according to example embodiments of inventive concepts.

FIG. 2 is a circuit diagram illustrating a cell array of a 3D semiconductor device according to example embodiments of inventive concepts. FIG. 3 is a perspective view illustrating a cell array of a 3D semiconductor device according to example embodiments of inventive concepts.

Referring to FIG. 2, a cell array of a 3D semiconductor device according to example embodiments of inventive concepts may include a plurality of common source lines CSL, a plurality of bit lines BL, and a plurality of cell strings CSTR disposed between the plurality of bit lines BL and the common source line CSL.

The bit lines BL may be two-dimensionally arranged. A plurality of the cell strings CSTR may be connected in parallel to each of the bit lines BL. The cell strings CSTR may be connected in common to the common source line CSL. That is, a plurality of the cell strings CSTR may be disposed between a plurality of the bit lines BL and one common source line CSL. According to example embodiments, the common source line CSL may be provided in a plural number and the common source lines CSL may be two-dimensionally arranged. The same voltage may be applied to the common source lines CSL. Alternatively, the common source lines CSL may be electrically controlled independently of each other.

Each of the cell strings CSTR may consist of a ground selection transistor GST connected to the common source line CSL, a string selection transistor SST connected to the bit line BL, and a plurality of memory cell transistors MCT between the ground and string selection transistors GST and SST. The ground selection transistor GST, the memory cell transistors MCT, and the string selection transistor SST may be connected in series.

The common source line CSL may be connected to sources of the ground selection transistors GST. A ground selection line GSL, a plurality of word lines WL0 to WL3, a plurality of string selection lines SSL, which are disposed between the common source line CSL and the bit lines BL, may be used as gate electrodes of the ground selection transistor GST, the memory cell transistors MCT, and the string selection transistors SST, respectively. Each of the memory cell transistors MCT includes a data storage element.

Referring to FIG. 3, a common source line CSL may be an impurity region which is formed in a substrate 10 or a conductive layer on the substrate 10. Bit lines BL may be conductive patterns (e.g., metal lines) which are disposed over the substrate 10. The bit lines BL may be two-dimensionally arranged and a plurality of cell strings CSTR may be connected in parallel to each of the bit lines BL. Thus, the cell strings CSTR may two-dimensionally arranged on the common source line CSL or the substrate 10.

Each of the cell strings CSTR may include a plurality of ground selection lines GSL1 and GSL2, a plurality of word lines WL0 to WL3, and a plurality of string selection lines SSL1 and SSL2 which are disposed between the common source line CSL and the bit lines BL. According to example embodiments, the plurality of string selection lines SSL1 and SSL2 may constitute the string selection line SSL of FIG. 2, and the plurality of string selection lines GSL1 and GSL2 may constitute the ground selection line GSL of FIG. 2. The ground selection lines GSL1 and GSL2, the word lines WL0 to WL3 and the string selection lines SSL1 and SSL2 may be conductive patterns stacked on the substrate 10.

Each of the cell strings CSTR may include a channel structure PL (or vertical semiconductor pattern), which may extend vertically from the common source line CSL and be connected to the bit line BL. The channel structures PL may penetrate the ground selection lines GSL1 and GSL2, the word lines WL0 to WL3 and the string selection lines SSL1 and SSL2. In other words, the channel structures PL may penetrate a plurality of conductive patterns stacked on the substrate 10. In addition, the channel structure PL may include a body portion B and a semiconductor pad D (i.e., impurity region) formed in one or two ends of the body portion B. For example, the semiconductor pad D may be formed at a top end of the channel structure PL (i.e., between the body portion B and the bit line BL).

A data storing layer DS may be disposed between the word lines WL0 to WL3 and the channel structures PL. According to example embodiments, the data storing layer DS may include a charge storing layer in which electrical charges can be stored. For example, the data storing layer DS may include one of a trap insulating layer, a floating gate electrode, or an insulating layer with conductive nano dots.

A dielectric layer serving as a gate dielectric layer of vertical transistor may be disposed between the ground selection lines GSL1 and GSL2 and the channel structure PL or between the string selection lines SSL1 and SSL2 and the channel structure PL. According to example embodiments, the dielectric layer may be formed of the same material as the data storing layer DS. According to example embodiments, the dielectric layer may be formed of a material (e.g., silicon oxide) different from the data storing layer DS.

In the above described structure, the channel structures PL may serve as a channel region of a metal-oxide-semiconductor field effect transistor (MOSFET), and the ground selection lines GSL1 and GSL2, the word lines WL0 to WL3, and the string selection lines SSL1 and SSL2 may serve as gate electrodes of the MOSFETs. In detail, the word lines WL0 to WL3 may serve as gate electrodes of memory cell transistors, and the ground selection lines GSL1 and GSL2 and the string selection lines SSL1 and SSL2 may serve as gate electrodes of selection transistors. Here, the selection transistors may be, for example, configured to control an electrical connection between the bit line or common source line BL or CSL, and the channel region of the memory cell transistor. In some aspects of the inventive concepts, it can be understood that the channel structure PL constitutes MOS capacitors along with the ground selection lines GSL1 and GSL2, the word lines WL0 to WL3 and the string selection lines SSL1 and SSL2.

Energy band structures of the channel structures PL may be controlled by voltages applied to the ground selection lines GSL1 and GSL2, the word lines WL0 to WL3, and the string selection lines SSL1 and SSL2. For example, portions of the channel structures PL adjacent to the word lines WL0 to WL3 may become in an inversion state by the voltages applied to the word lines WL0 to WL3. In addition, for example, other portions of the channel structures PL between the word lines WL0 to WL3 may also become in an inversion state by a fringe field generated from the word lines WL0 to WL3. According to example embodiments, the word lines WL0 to WL3 and the selection lines GSL1, GSL2, SSL1 and SSL2 may be formed closely in such a way that a distance between two adjacent ones of them is shorter than half a vertical width of an inversion region induced by the fringe field. In this case, the inversion regions can vertically overlap with each other by the voltages applied to the lines GSL1, GSL2, SSL1, SSL2, and WL0 to WL3, and the common source line CSL can be electrically connected to a selected bit line.

In other words, the cell string CSTR may be configured such that the selection transistors (e.g., ground and string selection transistors including the ground and string selection lines GSL1, GSL2, SSL1 and SSL2) and the memory cell transistors (e.g., MCT of FIG. 2) are electrically connected in series.

Figure 4:
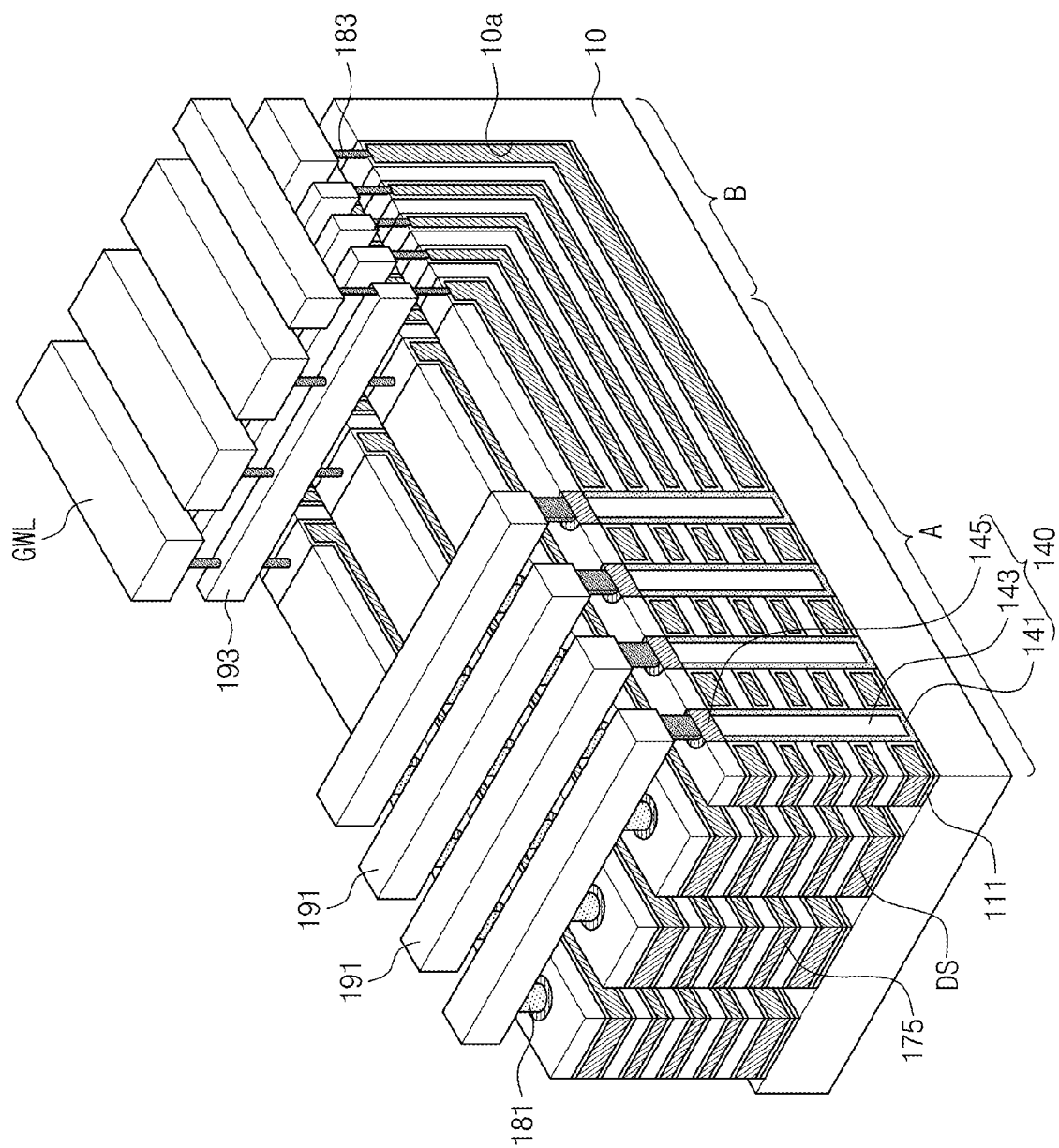
FIG. 4 is a perspective view illustrating a cell array region and a connection region of a 3D semiconductor device according to example embodiments of inventive concepts.

FIG. 4 is a perspective view illustrating a cell array region and a connection region of a 3D semiconductor device according to example embodiments of inventive concepts.

Referring to FIG. 4, a word line structure including conductive patterns 175 may be disposed on a substrate 10 including a cell array region A and a connection region B. Channel structures 140 penetrating the word line structure may be two-dimensionally arranged on the substrate 10 when viewed from a plan view. A data storing layer DS may be disposed between the word line structure and each of the channel structures 140. According to example embodiments for flash memory devices, the data storing layer DS may include a charge storing layer. Additionally, the data storing layer DS may further include a tunnel insulating layer disposed between the charge storing layer and the channel structure 140 and a blocking insulating layer disposed between the charge storing layer and the conductive pattern 175.

An interconnection structure may be disposed on the word line structure. The interconnection structure may include first contact plugs 181, bit lines 191, second contact plugs 183, and connecting wires 193.

According to example embodiments, the bit lines 191 connected to the channel structures 140 through the first contact plugs 181 may be formed to cross over the word line structure. The connecting wires 193 may be connected to the extensions of the conductive patterns 175 through the second contact plugs 183. Each of the connecting wires 193 may electrically connect the conductive patterns 175 disposed at the same level from a top surface of the substrate 10 to each other. Here, the number of the conductive patterns 175 connected to each of the connecting wires 193 may be variously determined depending on a product design-rule, a product standard, and product characteristics for program/erase/sense operations. Upper wires GWL may be disposed on the connecting wires 193. The upper wires GWL may connect the connecting wires 193 to the peripheral circuits.

According to example embodiments, some (e.g., uppermost conductive patterns and lowermost conductive patterns) of the conductive patterns 175 may be used as the gate electrodes of the ground and string selection transistors GST and SST described with reference to FIG. 2. In other words, in the 3D NAND flash memory device, the uppermost conductive pattern may be used as the gate electrode of the string selection transistor controlling an electrical connection between the bit lines 191 and the channel structures 140, and the lowermost conductive pattern may be used as the gate electrode of the ground selection transistor controlling an electrical connection between the common source line and the channel structures 140.

Hereinafter, a method of manufacturing a 3D semiconductor device according to example embodiments of inventive concepts will be described with reference to FIGS. 4 and 5 through 14 in more detail.

FIGS. 5 through 14 are cross-sectional views illustrating a method of manufacturing a 3D semiconductor device according to example embodiments of inventive concepts.

Figure 5:
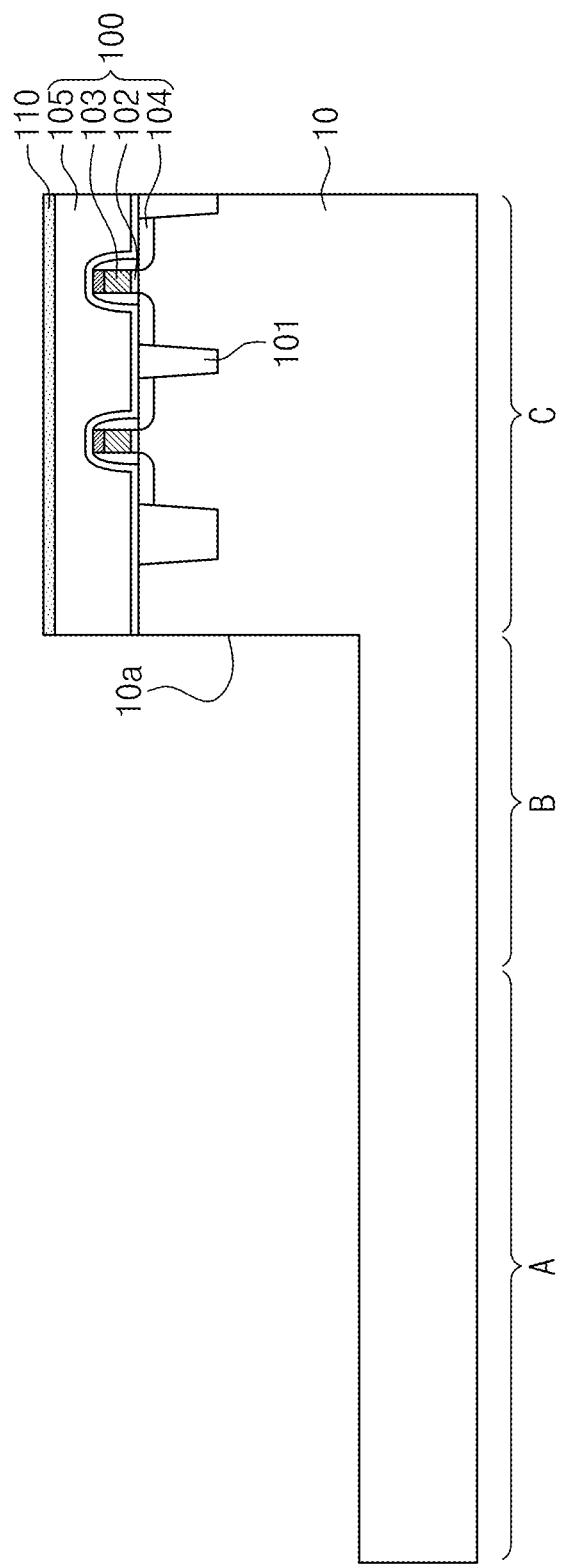
FIGS. 5 through 14 are cross-sectional views illustrating a method of manufacturing a 3D semiconductor device according to example embodiments of inventive concepts.

Referring to FIG. 5, a substrate 10 may include a cell array region A, a connection region B, and a peripheral circuits region C. Memory cells are disposed in the cell array region A, and driving circuits for driving the memory cells may be disposed in the peripheral circuits regions C. A connecting wire structure for an electrical connection between the memory cells and the driving circuits may be formed in the connection region B.

The substrate 10 may include one of a material having semiconductor characteristic (e.g., a silicon wafer), an insulating material (e.g., a glass), and a semiconductor or conductor covered by an insulating material. For example, the substrate 10 may be a silicon wafer having a first conductivity type.

A peripheral structure 100 may be formed on the substrate 10 of the peripheral circuits region C. According to example embodiments, the peripheral structure 100 may include peripheral circuits formed on the substrate 100 of the peripheral circuits region C, and at least one peripheral insulating layer 105 covering the peripheral circuits.

In more detail, forming the peripheral structure 100 may include forming a device isolation layer 101 defining an active region at the substrate 10 of the peripheral circuits region C, forming the peripheral circuits on the substrate 10, and forming the peripheral insulating layer 105 covering the peripheral circuits. Here, forming the peripheral circuits may include forming the word line driver, the sense amplifier, the row and column decoders, and the control circuits described with reference to FIG. 1. In other words, field effect transistors (FET), resistors, and wires constituting the peripheral circuits may be formed on the substrate 10 of the peripheral circuits region C. As illustrated in FIG. 5, the field effect transistors may include a gate insulating layer 102 and a gate pattern 103 sequentially stacked and source/drain regions 104 formed in the substrate 10 at both sides of the gate pattern 103.

An insulating material may be deposited on the substrate 10 provided with the peripheral circuits and then the insulating material may be planarized to form the peripheral insulating layer 105. For example, the peripheral insulating layer 105 may be formed of silicon oxide. Here, a thickness of the peripheral insulating layer 105 may be determined depending on a thickness of a stacked layer structure 200. The stacked layer structure 200 will be formed on the substrate 10 of the cell array region A in subsequent processes.

According to example embodiments, a peripheral planarization stop layer 110 may be formed on the peripheral structure 100. The peripheral planarization stop layer 110 may be formed on the peripheral insulating layer 105 covering the peripheral circuits. The peripheral planarization stop layer 110 may be formed of a material having an etch selectivity with respect to the peripheral insulating layer 105. For example, the peripheral planarization stop layer 110 may be formed of at least one of a silicon nitride layer, a silicon oxynitride layer and a poly-silicon layer.

Subsequently, a concave region 10a may be formed in the substrate 10 of the cell array region A and the connection region B.

The concave region 10a may have a bottom surface and sidewalls opposite to each other. The bottom surface of the concave region 10a may be located at a lower level than a top surface of the substrate of the peripheral circuits region C. In other words, a top surface of the substrate in the cell array region A may be formed to be lower than the top surface of the substrate in the peripheral circuits region C.

According to example embodiments, forming the concave region 10a may include recessing a top surface of the substrate 10 of the cell array region A to be lower than a top surface of the peripheral structure 100. In more detail, before the concave region 10a is formed, the peripheral insulating layer 105 and the peripheral planarization stop layer 110 may be formed on an entire surface of the substrate 10. A mask pattern (not shown) covering the peripheral circuits region C may be formed on the peripheral planarization stop layer 110. The peripheral planarization stop layer 110, the peripheral insulating layer 105, and the substrate 10 may be anisotropically etched using the mask pattern as an etch mask to form the concave region 10a.

According to example embodiments, after an insulating layer having a thickness corresponding to step difference between two regions A and C is formed on an entire surface of the substrate 10, the insulating layer of the cell array region A may be etched to form the concave region 10a.

Figure 6:
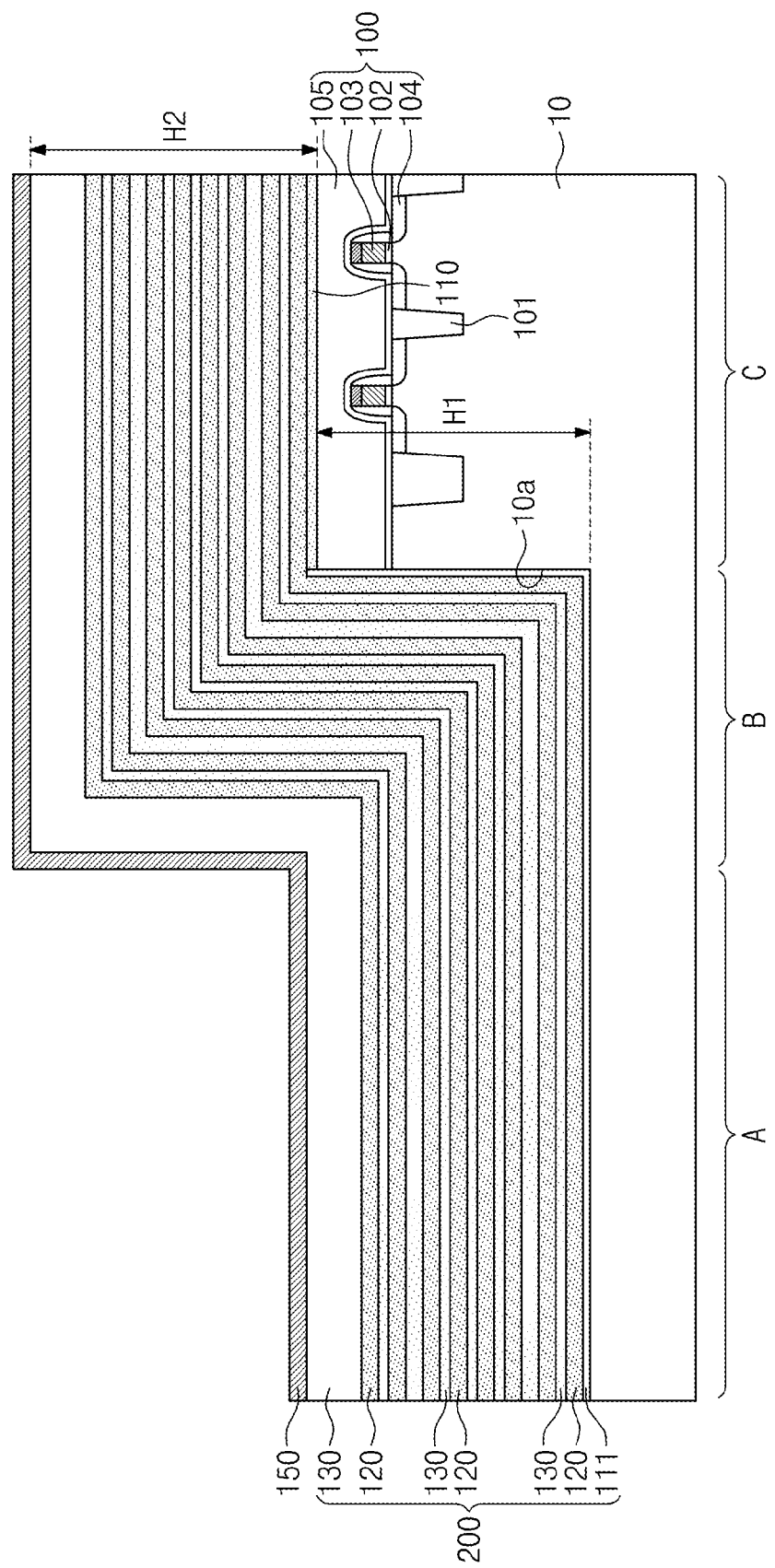

Referring to FIG. 6, a stacked layer structure 200 may be formed on the substrate 10 having the concave region 10a. The stacked layer structure 200 may include a plurality of thin layers being sequentially stacked.

The thin layers of the stacked layer structure 200 may be conformally formed on the substrate 10 having the concave region 10a. In other words, the stacked layer structure 200 may be formed on the bottom surface and the sidewalls of the concave region 10a and the top surface of the peripheral structure 100 to have a substantially uniform thickness. Thus, the stacked layer structure 200 may have a lowest top surface in the cell array region A and a highest top surface in the peripheral circuits region C. In other words, the stacked layer structure 200 may have a lower part having a top surface lower than the top surface of the peripheral structure 100 and a higher part having a top surface higher than the top surface of the peripheral structure 100.

According to example embodiments, the lower part of the stacked layer structure 200 may completely fill the concave region 10a. In other words, a total thickness H2 of the stacked layer structure 200 may be equal to or greater than a height difference H1 between a structure of the cell array region A and a structure of peripheral circuits region C. In this case, the lowest top surface of the stacked layer structure 200 may be higher than or coplanar with the top surface of the peripheral structure 100. The height difference H1 between the cell array region A and the peripheral circuits region C may be a vertical distance between the bottom surface of the concave region 10a and the top surface of the peripheral insulating layer 105 of the peripheral circuits region C.

Alternatively, the lower part of the stacked layer structure 200 may partially fill the concave region 10a. That is, the total thickness H2 of the stacked layer structure 200 may be less than a depth of the concave region 10a. In other words, the total thickness H2 of the stacked layer structure 200 may be less than the height difference H1 between the structure of the cell array region A and the structure of the peripheral circuits region C. In this case, the lowest top surface of the stacked layer structure 200 may be lower than the top surface of the peripheral structure 100.

According to example embodiments, the stacked layer structure 200 may include sacrificial layers 120 and insulating layers 130 which are alternately and repeatedly stacked.

The sacrificial layers 120 may be formed of a material having an etch selectivity with respect to the insulating layers 130. In other words, in a process etching the sacrificial layers 120 using an etch recipe, an etch rate of the sacrificial layers 120 may be greater than an etch rate of the insulating layer 130. The each selectivity of the sacrificial layers 120 and the insulating layers 130 may be quantitatively represented using ratio of the etch rates. According to example embodiments, the ratio of the etch rate of the insulating layers 130 to the etch rate of the sacrificial layers 120 may have a range of about 1:10 to about 1:200 (particularly, a range of about 1:30 to about 1:100). For example, the insulating layers 130 may be formed of silicon oxide layers, and the sacrificial layers 120 may be formed of silicon nitride layers.

According to example embodiments, the sacrificial layers 120 and the insulating layers 130 may be conformally formed on the substrate 100 having the concave region 10a. For example, the sacrificial layers 120 and the insulating layers 130 may be formed by one of deposition techniques providing excellent step coverage, e.g., a chemical vapor deposition technique or an atomic layer deposition technique. In this case, each of the sacrificial layers 120 and the insulating layers 130 may have a substantially uniform thickness to cover the bottom surface of the concave region 10a (i.e., the top surface of the substrate 10 of the cell array region A and the connection region B), the sidewalls of the concave region 10a, and the top surface of the peripheral planarization stop layer 110.

Additionally, a top surface of the uppermost sacrificial layer 120 among the sacrificial layers 120 stacked in the cell array region A may be lower than the top surface of the peripheral structure 100.

According to example embodiments, before the stacked layer structure 200 is formed, a buffer layer 111 may further be formed on the substrate 10. The buffer layer 111 may be a silicon oxide layer formed by a thermal oxidation technique. In this case, the buffer layer 111 may be formed to cover an inner surface of the concave region 10a. According to example embodiments, the buffer layer 111 may be formed by a deposition technique similarly to the thin layers constituting the stacked layer structure 200.

Subsequently, referring to FIGS. 6 through 10, after the stacked layer structure 200 is conformally formed on the substrate 10 having the concave region 10a, a planarization process may be performed on the stacked layer structure 200 to form a mold structure in the concave region 10a.

Figure 7:
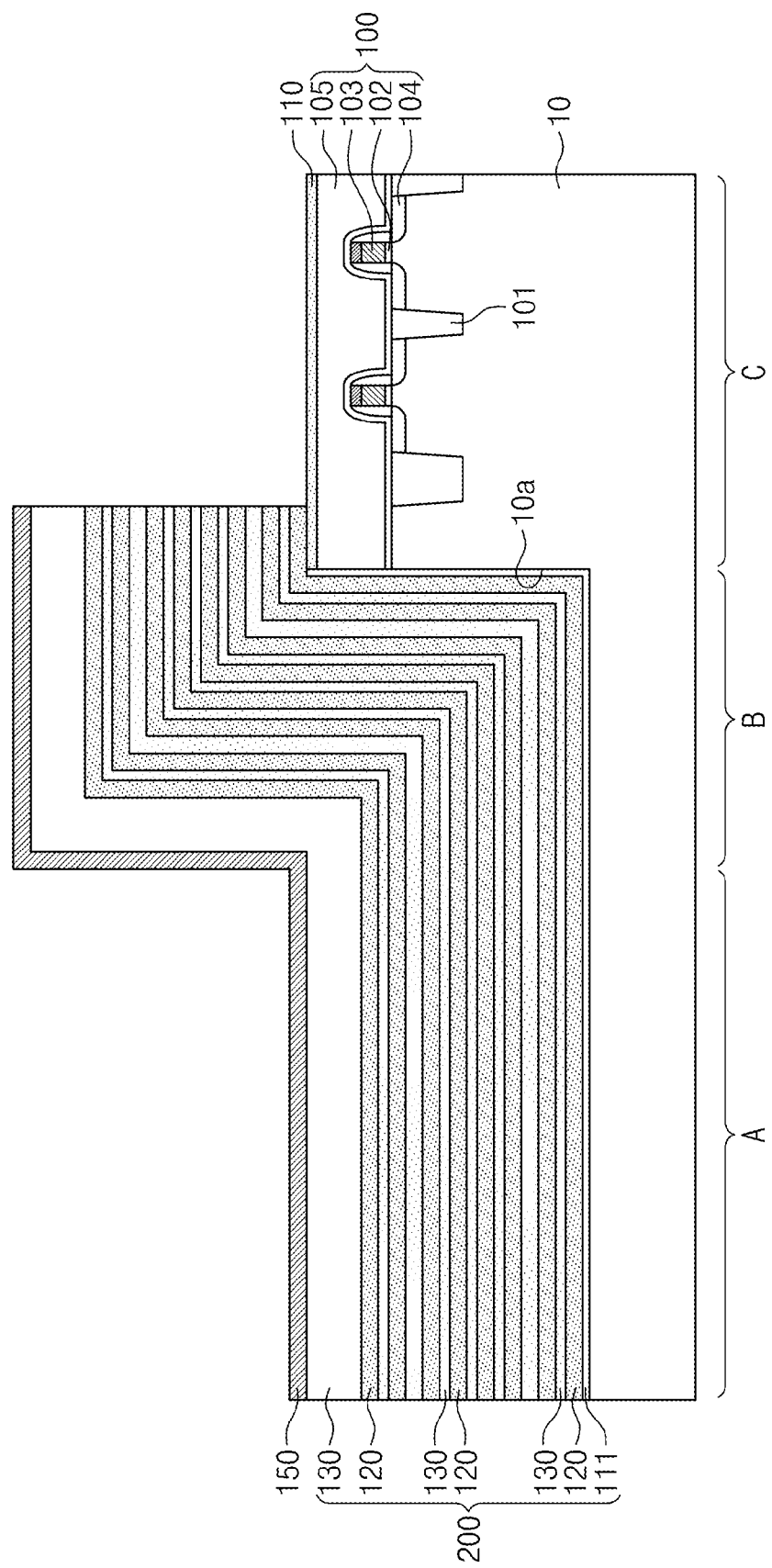
Figure 8:
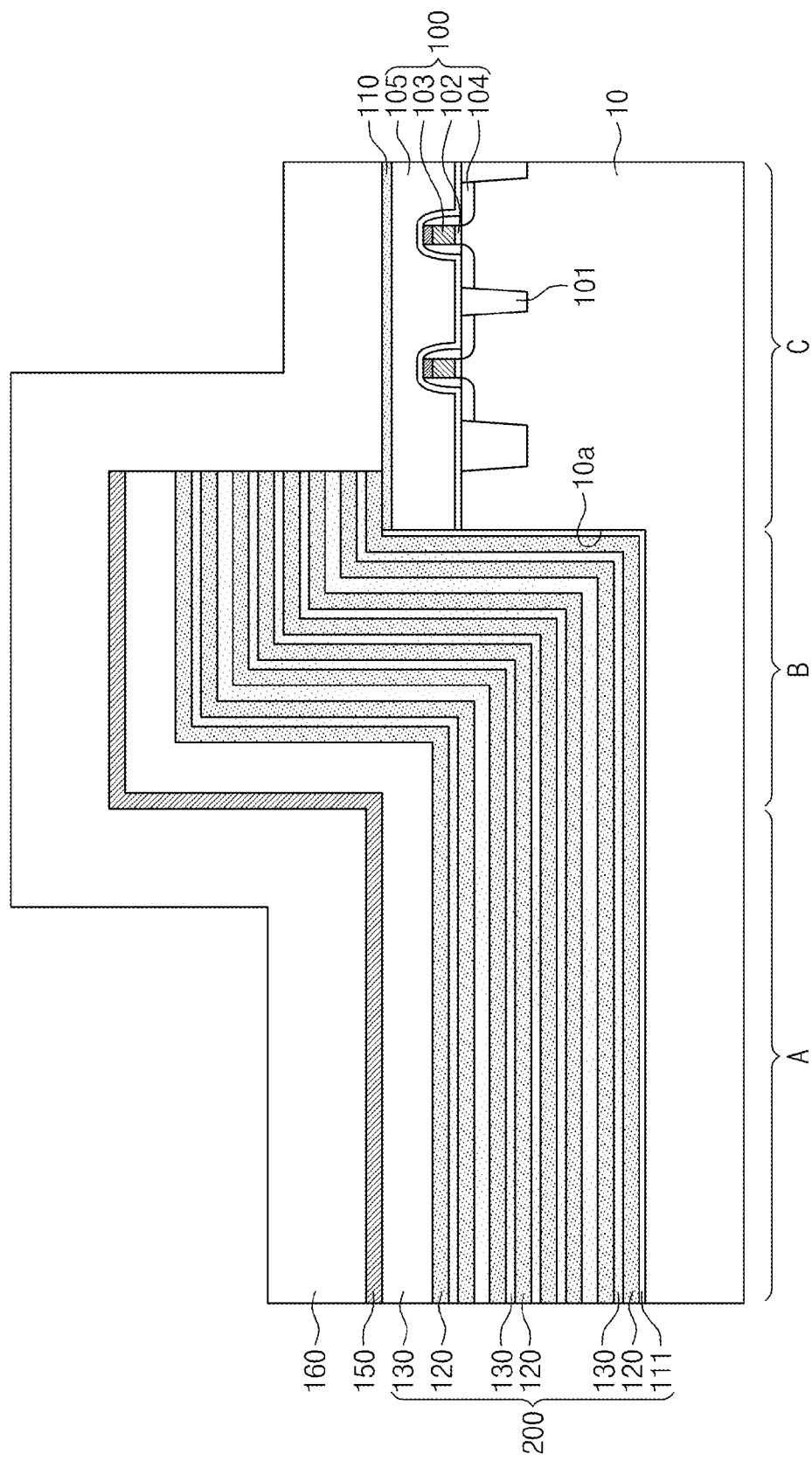
Figure 9:
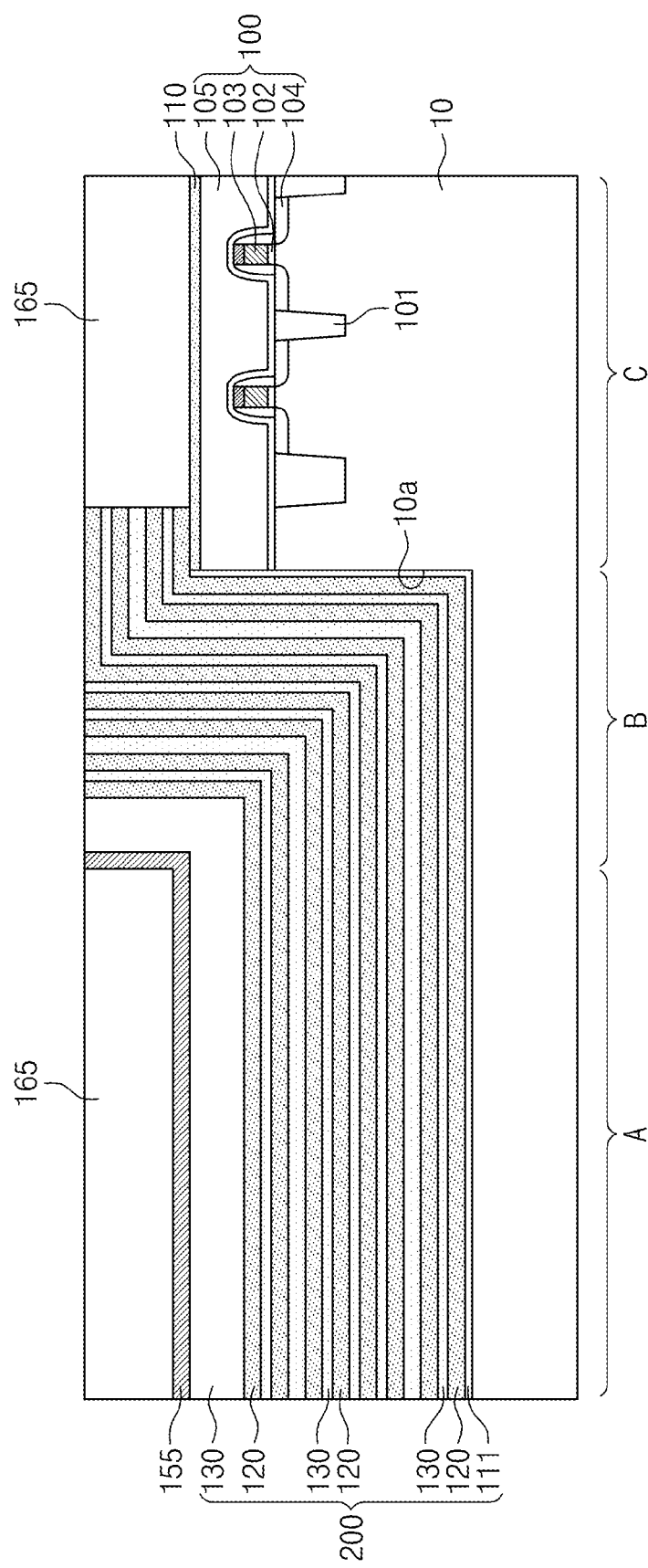
Figure 10:
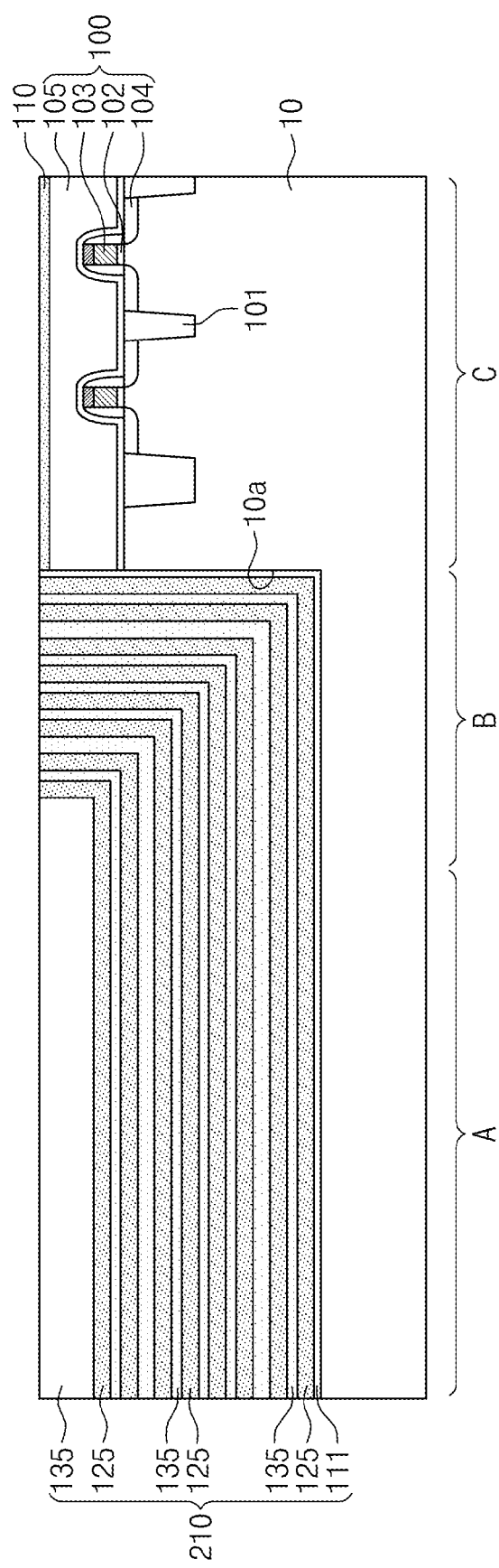

In more detail, the method of forming the mold structure may include: forming a planarization stop layer 150 to cover the stacked layer structure 200 as illustrated in FIG. 6; removing a portion of the planarization stop layer 150 and a portion of the stacked layer structure 200 in the peripheral circuits region to form a pillar portion locally protruded between the cell array region A and the peripheral circuits region C as illustrated in FIG. 7; and planarizing the stacked layer structure 200 having the locally protruded pillar portion as illustrated in FIGS. 8 through 10. Here, a method of planarizing the stacked layer structure 200 may include a first planarization process removing the pillar portion locally protruded between the cell array region A and the peripheral circuits region C, and a second planarization process exposing top surfaces of the stacked layers simultaneously.

Referring to FIG. 6 again, the planarization stop layer 150 may be conformally formed on the stacked layer structure 200. According to example embodiments, the planarization stop layer 150 may be thicker than the peripheral planarization stop layer 110. When the process planarizing the stacked layer structure 20 is performed, the planarization stop layer 150 may limit (and/or prevent) a thickness of the stacked layer structure 200 in the cell array region A from be changed.

The planarization stop layer 150 may be formed of a material having an etch selectivity with respect to the stacked layer structure 200 in the process planarizing the stacked layer structure 200 (e.g., a chemical mechanical polishing (CMP) process). That is, the planarization stop layer 150 may limit (and/or minimize) the removal of the stacked layer structure in the process planarizing the stacked layer structure 200 using a planarization recipe. In more detail, the planarization stop layer 150 may be formed of a material having an etch selectivity with respect to the sacrificial layers 120 and the insulating layers 130.

According to example embodiments, the planarization stop layer 150 may be formed of at least one selected from a group consisting of poly-silicon, silicon nitride (SiN), silicon oxynitride (SiON), silicon carbide (SiC), silicon oxycarbide (SiOC), a conductive material, black diamond, CORAL, boron nitride (BN), an anti-reflective coating (ARC) material, and any combination thereof. For example, the planarization stop layer 150 may be formed of poly-silicon. The removal rate of the poly-silicon may be less than the removal rate of the stacked layer structure 200 in the subsequent process of planarizing the stacked layer structure 200. In other words, the removal rate of the planarization stop layer 150 may be less than the removal rates of the sacrificial layers 120 and the insulating layers 130 in the process of planarizing the stacked layer structure 200.

According to example embodiments, a top surface of the planarization stop layer 150 in the cell array region A and the top surface of the peripheral planarization stop layer 110 may be disposed at substantially the same level from the top surface of the substrate 10 of the cell array region A. Alternatively, according to example embodiments, the top surface of the planarization stop layer 150 in the cell array region A may be disposed at a lower level than the top surface of the peripheral planarization stop layer 110. Here, a level difference between the top surface of the planarization stop layer 150 in the cell array region A and the top surface of the peripheral planarization stop layer 110 may have a range of about 0 Å to about 500 Å. The level difference may be a level difference removed by the planarization process.

Referring to FIG. 7, a portion of the stacked layer structure 200 in the peripheral circuits region C may be removed. In more detail, a mask pattern exposing the peripheral circuits region C may be formed on the planarization stop layer 150, and then the planarization stop layer 150 and the stacked layer structure 200 may be anisotropically etched using the mask pattern as an etch mask to expose a portion of the peripheral planarization stop layer 110. That is, a portion of the higher part of the stacked layer structure may be etched to expose the peripheral planarization stop layer 110.

Since a portion of the stacked layer structure 200 in the peripheral circuits region C is removed, the stacked layer structure 200 may have the pillar portion upwardly protruded above the top surface of the peripheral structure 100.

As described above, since the portion of the stacked layer structure 200 in the peripheral circuits region C is removed by the patterning process, a process burden (e.g., a processing time or cost, etc) may decrease in the subsequent process of planarizing the stacked layer structure 200.

Referring to FIG. 8, a buffer insulating layer 160 may be conformally formed on the resultant structure where the stacked layer structure 200 having the pillar portion is formed. According to example embodiments, the buffer insulating layer 160 may be formed on the planarization stop layer 150 and the exposed peripheral planarization stop layer 110.

The buffer insulating layer 160 may be formed of an insulating material having a different removal rate from the planarization stop layer 150 in the planarization process. For example, the buffer insulating layer 160 may include one of high density plasma (HDP) oxide, tetraethylorthosilicate (TEOS), plasma enhanced tetraethylorthosilicate (PE-TEOS), $O_3$-tetraethylorthosilicate ($O_3$-TEOS), undoped silicate glass (USG), phosphosilicate glass (PSG), borosilicate glass (BSG), borophosphosilicate glass (BPSG), fluoride silicate glass (FSG), spin on glass (SOG), tonen silazene (TOSZ), and any combination thereof. Alternatively, the buffer insulating layer 160 may include silicon nitride, silicon oxynitride, and/or a low-k dielectric material having a low dielectric constant.

The buffer insulating layer 160 may be formed using a physical vapor deposition (PVD) method, a chemical vapor deposition (CVD) method, a sub-atmospheric chemical vapor deposition (SACVD) method, a low pressure chemical vapor deposition (LPCVD) method, a plasma enhanced chemical vapor deposition (PECVD) method, or a high density plasma chemical vapor deposition(HDP CVD) method.

Subsequently, referring to FIGS. 9 and 10, the stacked layer structure 200 having the local pillar portion may be planarized to form a mold structure 210. Here, planarizing the stacked layer structure 200 may include the first planarization process removing the pillar portion locally protruded between the cell array region A and the peripheral circuits region C, and the second planarization process exposing top surfaces of the stacked layers simultaneously.

In more detail, referring to FIG. 9, the first planarization process may be performed to remove the pillar portion of the connection region B. Due to the first planarization process, the structures on the entire surface of the substrate 10 may be planarized to have substantially the same height. Since the first planarization process is performed, a portion of the stacked layer structure 200 located in the connection region B may be exposed. And the planarization stop layer 150 in the cell array region A and the peripheral planarization stop layer 110 may not be exposed to remain due to the planarized buffer insulating layer 165 planarized by the first planarization process.

The first planarization process may be performed by a chemical mechanical polishing (CMP) process. The removal rates of the buffer insulating layer 160, the planarization stop layer 150 and the stacked layer structure 200 in the CMP process may be determined based on various factors such as, for example, a type of slurry, composition of a polishing pad, a structure and a type of a polishing head, a relative movement amount between the polishing pad and the substrate 10, a pressure applied to the substrate 10 during the movement of the substrate 10 relative to the polishing pad, a type of a polished pattern, and/or uniformity of the buffer insulating layer 160 and the planarization stop layer 150.

According to example embodiments, the CMP process for the first planarization process may use slurry having a lower selectivity with respect to the planarization stop layer 150 and the insulating layer 130 and the sacrificial layers 120 of the stacked layer structure 200. For example, if the stacked layer structure 200 includes silicon nitride layers and silicon oxide layers, the buffer insulating layer 160 is formed of a silicon oxide layer, and the planarization stop layer 150 may be formed of a poly-silicon layer, a silica slurry and/or a ceria slurry may be used in the CMP process for the first planarization process.

Additionally, the first planarization process may be controlled using an end point detection (EPD) method. The EPD method is a method which detects an end point of a polishing process by monitoring a polishing state during the polishing process. That is, a process time of the first planarization process may be controlled by detecting the change of the highest point of the stacked layer structure 200.

Referring to FIG. 10, the second planarization process may be performed on the stacked layer structure 200.

According to example embodiments, the second planarization process may be performed using a CMP process and the planarization stop layer 150 in the cell array region A may be used as the planarization end point during the second planarization process. When the second planarization process is performed, a thickness of the planarization stop layer 150 of the cell array region A may be reduced.

Additionally, the peripheral planarization stop layer 110 of the peripheral circuits region C may be used as the planarization end point. If the peripheral planarization stop layer 110 may be formed of a material having the removal rate higher than that of the planarization stop layer 150, the peripheral planarization stop layer 110 may be removed by the second planarization process.

The second planarization process may also be controlled using the EPD method. Since different kinds of materials may be exposed in the second planarization process, the end point may be detected by detecting an optical change of layers exposed through a driving amount change of the polishing pad and/or the second planarization process.

A slurry having and etch selectivity between the buffer insulating layer 160 and the planarization stop layer 150 may be provided during the second planarization process. For example, a ratio of the buffer insulating layer 160 to the planarization stop layer 150 may have a range of about 4:1 to about 200:1. For example, the slurry may include one of a silica slurry, a ceria slurry, a mangania slurry, an alumina slurry, a titania slurry, a zirconia slurry, a Germania slurry, or any combination thereof.

Since the removal rate of the planarization stop layer 150 is less than the removal rate of the buffer insulating layer 160 in the second planarization process, it may be possible to limit (and/or prevent) the thickness of the stacked layer structure 200 of the cell array region A from being changed. In other words, it may be possible to limit (and/or prevent) the stacked layer structure 200 of the cell array region A from excessively etching.

Furthermore, according to example embodiments, the second planarization process may include exposing top surfaces of the insulating layers 130 and the sacrificial layers 120 of the stacked layer structure in the connection region B simultaneously. Thus, the mold structure 210 may be formed in the concave region 10a of the substrate 10. In other words, the mod structure 210 including sacrificial layers 125 and insulating layers 135 alternately and repeatedly stacked may be formed on the substrate 10 of the cell array region A and the connection region B. Here, each of the sacrificial layers 125 and the insulating layers 135 constituting the mold structure 210 may include a horizontal portion parallel to the top surface of the substrate 10 and an extending portion parallel to the sidewall of the concave region 10a. Due to the second planarization process, the extending portions of the sacrificial layers 125 and the insulating layers 135 may have top surfaces exposed at substantially the same level from the top surface of the substrate 10

According to example embodiments, after the first and second planarization processes are performed, a process removing the planarization stop layer 150 remaining on the mold structure 210 may be performed. For removing the planarization stop layer 150, an isotropic etch process or an anisotropic etch process may be performed using an etch recipe having an etch selectivity with respect to the layers of the mold structure 210

After the first and second planarization processes for the stacked layer structure 200 are finished, remaining slurry and a residual may be removed using deionized (DI) water. Additionally, the planarization stop layer 150 remaining in the cell array region A and the peripheral planarization stop layer 110 in the peripheral circuits region C may be removed.

Figure 11:
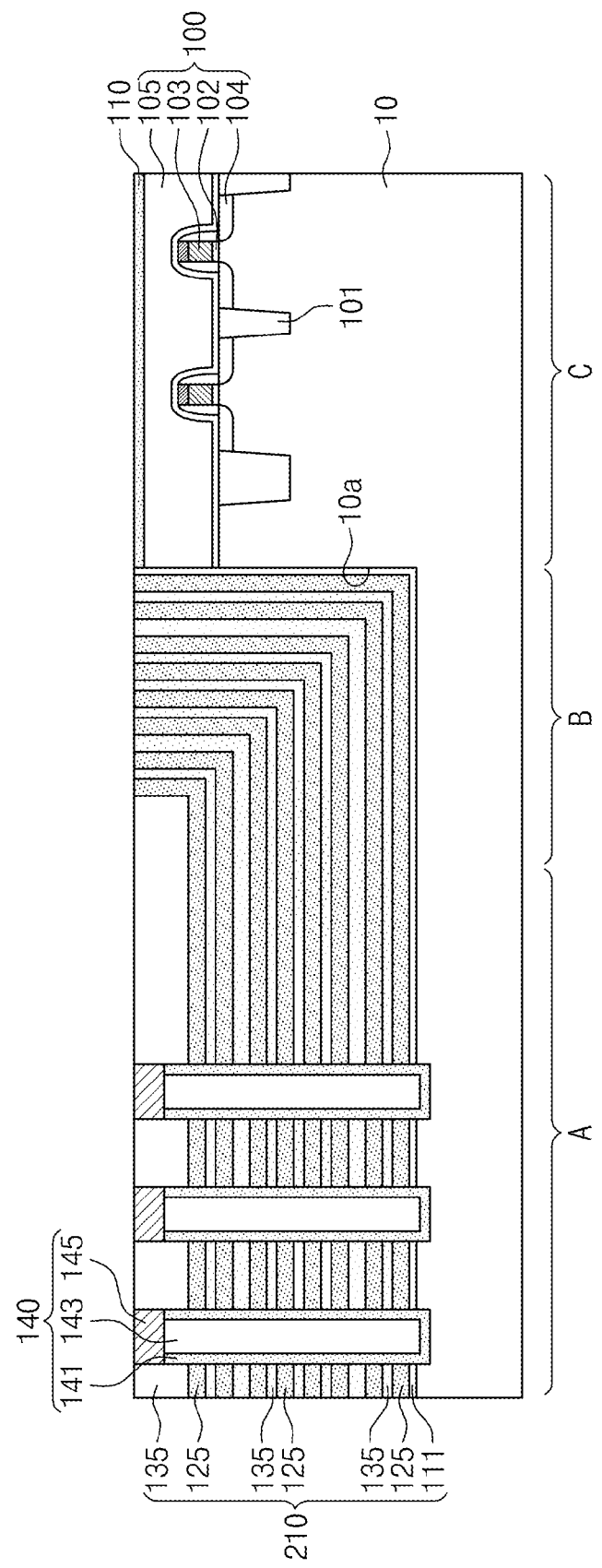

Referring to FIG. 11, channel structures 140 may be formed to penetrate the mold structure 210 in the cell array region A. The channel structures 140 may be connected to the substrate 10. According to example embodiments, the channel structures 140 may be two-dimensionally arranged on the substrate 10 when viewed from a top view.

Each of the channel structures 140 may be a semiconductor pattern 141 covering a bottom surface and a sidewall of a through hole penetrating the mold structure 210. According to example embodiments, the semiconductor pattern 141 may partially fill the through hole. In this case, a semiconductor pad 145 may be formed on the semiconductor pattern 141, and a filling insulating pattern 143 may be formed in an inner space confined by the semiconductor pattern 141 and the semiconductor pad 145.

According to example embodiments, the semiconductor pattern 141 may be a polycrystalline semiconductor material (e.g., poly-silicon) formed by a chemical vapor deposition technique. According to example embodiments, the semiconductor pattern 141 may be one of a single-crystalline silicon pattern, an organic semiconductor pattern, and a carbon nano structure which are formed by one of chemical vapor deposition techniques and epitaxial techniques.

The filling insulating pattern 143 may be formed to fill the through hole in which the semiconductor pattern 141 is formed. The filling insulating pattern 143 may be formed of at least one of insulating materials. For example, the filling insulating pattern 143 may be formed of silicon oxide and/or insulating materials formed by a spin on glass (SOG) technique. According to example embodiments, before the filling insulating pattern 143 is formed, a hydrogen annealing process may further be performed on the resultant structure where the semiconductor pattern 141 in a gas atmosphere including hydrogen and/or heavy hydrogen. The hydrogen annealing process may cure lattice defects in the semiconductor pattern 141.

The semiconductor pad 145 may be formed of a semiconductor material having different characteristic from the semiconductor pattern 141 in at least one of conductivity type and impurity concentration. For example, the semiconductor pattern 141 may be formed of p-type or intrinsic semiconductor and the semiconductor pad 1455 may be formed of n+ type semiconductor.

Subsequently, a process replacing the sacrificial layers 125 of the mold structure 210 with a conductive material layer may be performed. The replacement process may include removing the sacrificial layers 125 to form recess regions 170 between the insulating layers 135 as illustrated in FIG. 12; and forming a data string layer DS and a conductive pattern 175 in each of the recess regions 170 as illustrated in FIG. 13.

In more detail, as illustrated in FIG. 4, the mold structures 210 may be patterned in line shapes to form trenches exposing the top surface of the substrate 10. The trenches may be formed to be spaced apart from the channel structures 140.

Figure 12:
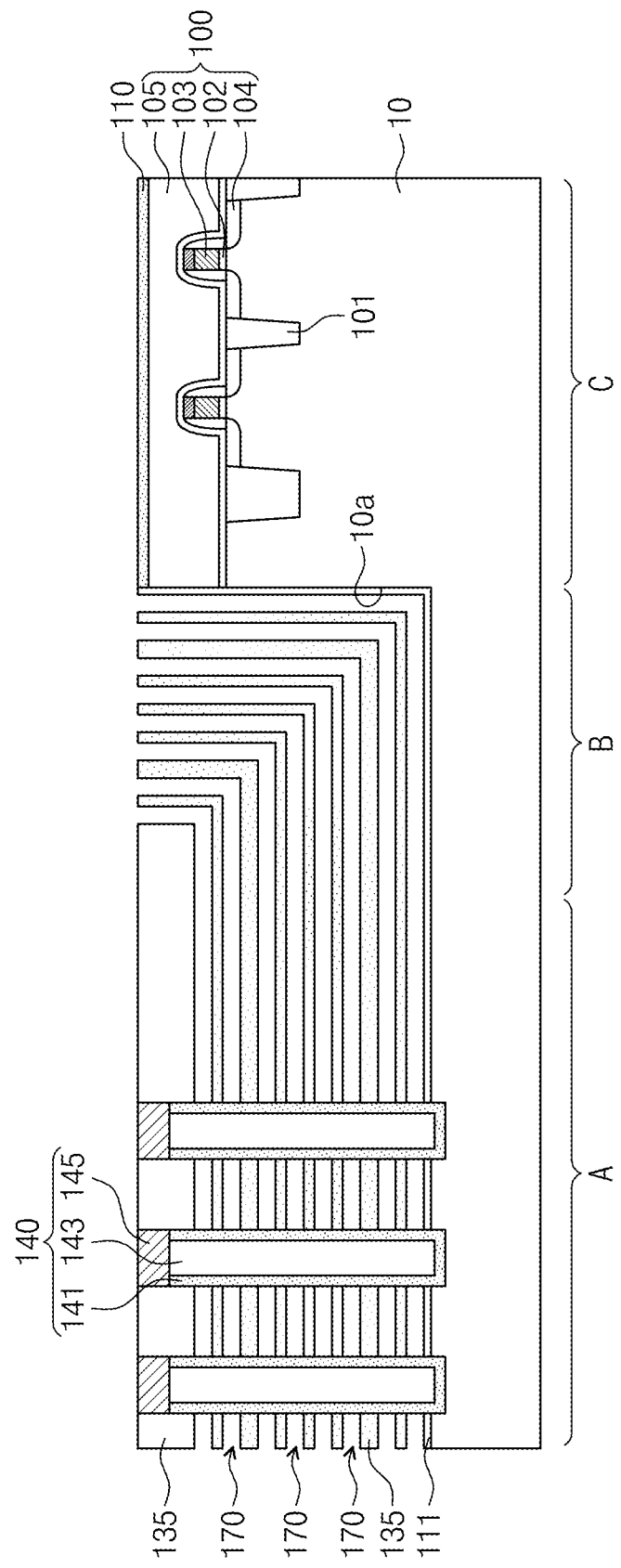
Figure 13:
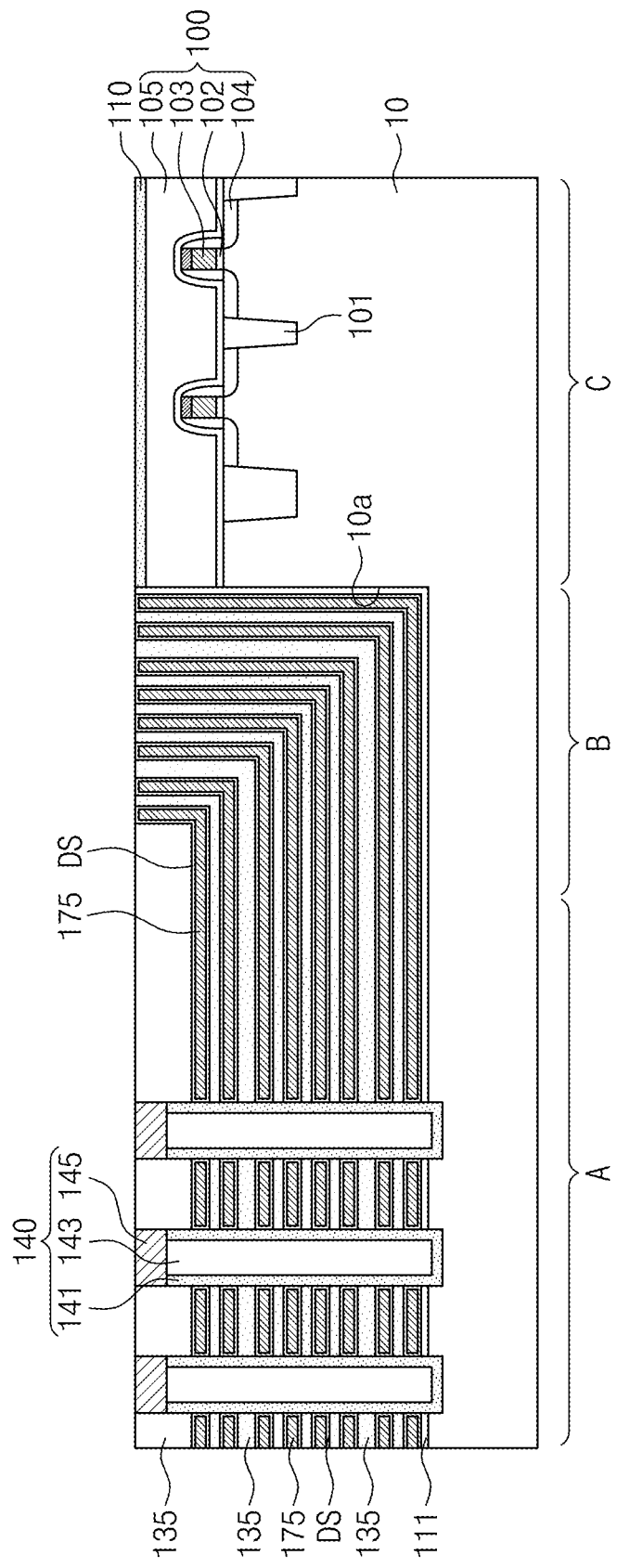

Subsequently, the sacrificial layers 125 exposed by the trenches may be selectively and horizontally etched to form the recess regions 170 between the insulating layers 135 as illustrated in FIG. 12. That is, the recess regions 170 may horizontally extend between the insulating layers 135 from the trench to expose sidewalls of the semiconductor patterns 141. The boundaries of the recess regions 170 may be confined by top/bottom surfaces of the insulating layers 135, the sidewalls of the semiconductor patterns 141, and the trenches.

The sacrificial layers 125 may be isotropically etched using an etch recipe having an etch selectivity with respect to the insulating layers 135 to form the recess regions 170. Here, the sacrificial layers 125 may be completely removed by an isotropic etch process. For example, if the sacrificial layers 125 are silicon nitride layers and the insulating layers 135 are silicon oxide layers, the isotropic etch process may be performed using an etch solution including phosphoric acid.

According to example embodiments, since the recess regions 170 are formed by horizontally etching the sacrificial layers 125, the recess regions 170 may include a horizontal portions parallel to the top surface of the substrate 10 in the cell array region A and extending portions parallel to the sidewall of the concave region 10a in the connection region B, like the sacrificial layers 125.

Even though the peripheral planarization stop layer 110 remaining on the peripheral structure 100 depicts in drawings, According to example embodiments, during the etch process removing the sacrificial layers 125, the peripheral planarization stop layer 110 remaining on the peripheral structure 100 may be removed.

Referring to FIG. 13, the data storing layer DS and the conductive pattern 175 may be sequentially formed on an inner surface of each of the recess regions 170.

Forming the conductive patterns 175 may include: forming a conductive layer in the recess regions 170 and the trenches in which the data storing layer DS is formed; and removing the conductive layer in the trenches to form the conductive patterns 175 vertically separated from each other. After the conductive layer in the trenches is removed, the trenches may be filled with at least one of insulating materials.

The conductive layer may be formed by a deposition technique providing excellent step coverage, for example, a chemical vapor deposition technique or an atomic layer deposition technique. Thus, the conductive layer may fill the recess regions 170 and be conformally formed in the trenches. In more detail, the conductive layer may be deposited with a thickness equal to or greater than a half of a thickness of the recess region 170. For example, the conductive layer may include at least one of doped poly-silicon, tungsten, metal nitrides, and metal silicides. According to example embodiments, as illustrated in FIGS. 21A through 21D, the formation of the conductive layer may include sequentially forming a barrier metal layer 175b (e.g., metal nitride) and a metal layer 175a (e.g., tungsten). However, the inventive concept is not limited to the 3D flash memory device. Thus, a material and a structure of the conductive layer may be variously modified. Reference number 177 in FIGS. 21A through 21D corresponds to a device isolation pattern. The device isolation pattern 177 may include a dielectric material, for example silicon oxide, but example embodiments are not limited thereto.

The conductive layer in the trenches may be anisotropically or isotropically etched to be removed. The conductive patterns 175 formed by the above described methods may be confinedly formed in the recess regions 170 to be used as electrodes changing data stored in the data storing layer DS.

According to example embodiments, since the conductive patterns 175 have shapes defined by the recess regions 170, the conductive patterns may include horizontal portions parallel to the top surface the substrate 10 of the cell array region A and extending portions parallel to the sidewall of the concave region 10a in the connection region B. Additionally, the extending portions of the conductive patterns 174 may have top surfaces exposed at substantially the same level from the top surface of the substrate 10. Moreover, lengths of the extending portions of the conductive patterns 175 may become reduced as the conductive patterns 175 become far away from the substrate 10.

According to example embodiments, since the conductive patterns 175 are formed after the peripheral structure 100 is formed, the top surfaces of the extending portions of the conductive patterns 175 may be disposed at a higher level than the top surface of the substrate 10 of the peripheral circuits regions C.

According to example embodiments, the data storing layer DS may be formed to conformally cover the mold structure 210 having the recess regions 170 before the conductive patterns 175 are formed. The data storing layer DS may be formed by a deposition technique providing excellent step coverage, for example, a chemical vapor deposition technique or an atomic layer deposition technique. The data storing layer DS may have a thickness less than a half of the thickness of the recess region 170. The data storing layer DS may be formed on the sidewalls of the semiconductor patterns 141 and may extend along bottom surfaces and top surfaces of the insulating layers 135 defining the recess regions 170. Additionally, the data storing layer DS formed by the deposition process may be formed on the substrate 10 exposed by the trenches and on a top surface of the uppermost insulating layer 135. The data storing layer DS may cover sidewalls of the insulating layers 130 as illustrated in FIG. 21B. The data storing layer DS may cover a top surface of the substrate 10 or the buffer layer 111 exposed by the lowermost recess region 170.

According to example embodiments, the data storing layer DS may include one of a trap insulating layer, a floating gate electrode, or an insulating layer including conductive nano dots. If the data storing layer DS includes a charge storing layer, the date stored in the data storing layer DS may be changed using Fowler-Nordheim tunneling caused by a voltage difference between the semiconductor pattern and the conductive pattern 175. Alternatively, the data storing layer DS may be a thin layer capable of storing data based on other operation principles, for example, a thin layer for a phase change memory or a thin layer for a variable resistance memory.

Figure 21A:
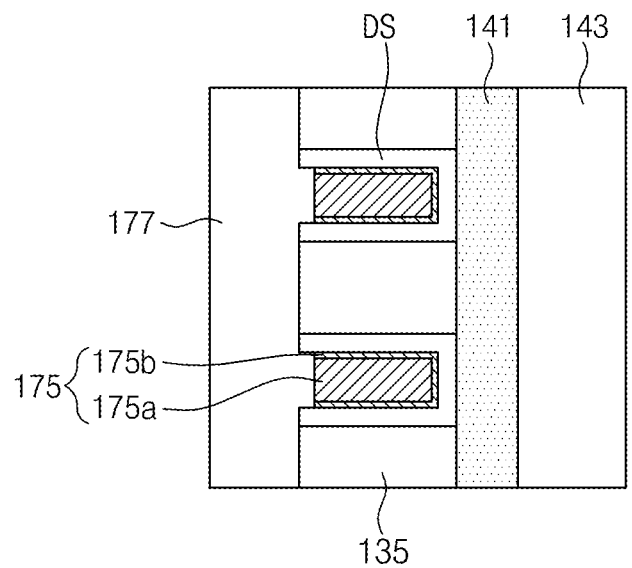
FIGS. 21A through 21D are enlarged views illustrating a portion 'a' of FIG. 14.
Figure 21B:
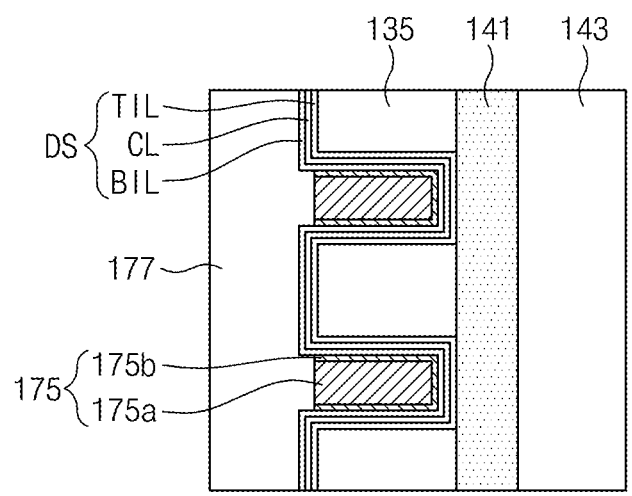
Figure 21C:
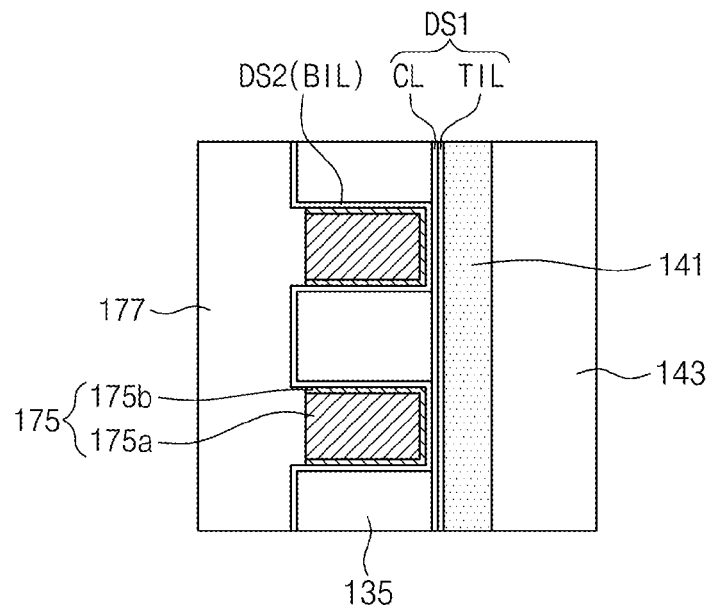
Figure 21D:
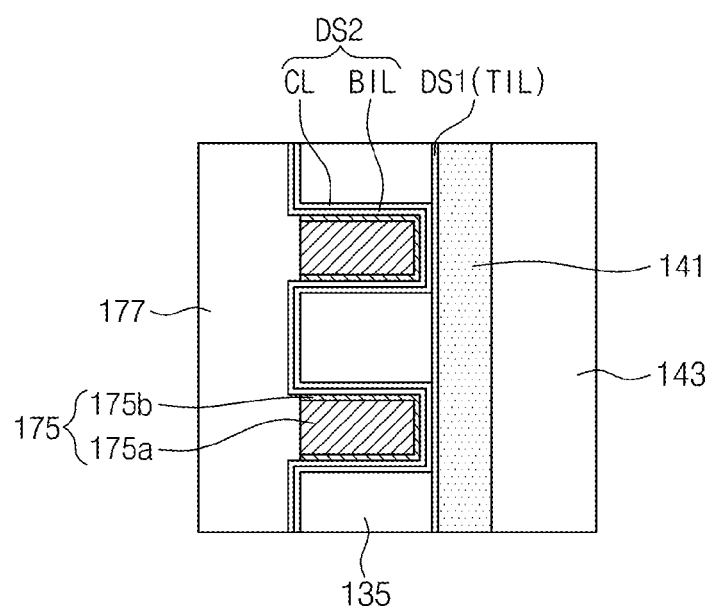

According to example embodiments, as illustrated in FIGS. 21B through 21D, the data storing layer DS may include a tunnel insulating layer TIL, a charge storing layer CL, and a blocking insulating layer BIL sequentially stacked.

The tunnel insulating layer TIL may be formed of a material having a dielectric constant lower than that of the blocking insulating layer BIL. For example, the tunnel insulating layer TIL may include at least one of oxide, nitride, and oxynitride.

The charge storing layer CL may be an insulating layer having rich charge trap sites or an insulating layer including conductive grains. According to example embodiments, the tunnel insulating layer TIL may be a silicon oxide layer, the charge storing layer CL may be a silicon nitride layer, and the blocking insulating layer BIL may include an aluminum oxide layer.

The blocking insulating layer BIL may include at least one of a silicon oxide layer, a silicon nitride layer, a silicon oxynitride layer, and high-k dielectric layers. The blocking insulating layer BIL may be multi-layered. The high-k dielectric layer is formed of an insulating material having a dielectric constant higher than that of silicon oxide. The high-k dielectric layer may include at least one of tantalum oxide, titanium oxide, hafnium oxide, zirconium oxide, aluminum oxide, yttrium oxide, niobium oxide, cesium oxide, indium oxide, iridium oxide, BST, and PZT.

Even though not shown, according to example embodiments, the blocking insulating layer BIL may consist of a first blocking insulating layer and a second blocking insulating layer. The first and second blocking insulating layers may be formed of materials different from each other. One of the first and second blocking insulating layers may include a material having a band-gap narrower than that of the tunnel insulating layer TIL and wider than that of the charge storing layer CL. For example, the first blocking insulating layer may be formed of one of high-k dielectric materials such as aluminum oxide and hafnium oxide, and the second blocking insulating layer may be formed of a material having a smaller dielectric constant than that of the first blocking insulating layer. Alternatively, the second blocking insulating layer may be formed of one of high-k dielectric materials, and the first blocking insulating layer may be formed of a material having a smaller dielectric constant than the second blocking insulating layer.

According to example embodiments, in the data storing layer DS consisting of the tunnel insulating layer TIL, the charge storing layer CL, and the blocking insulating layer BIL sequentially stacked on the sidewall of the semiconductor pattern 141, the tunnel insulating layer TIL and the charge storing layer CL may vertically extend to cross inner sidewalls of the conductive patterns 175 and the insulating layers adjacent to the semiconductor pattern 141 as illustrated in FIG. 21C. In other words, the tunnel insulating layer TIL and the charge storing layer CL may be formed on the inner sidewall of the through hole before the semiconductor pattern 141 described with reference to FIG. 11 is formed. And the blocking insulating layer BIL may be conformally formed on an inner surface of the recess region 170 after the recess region 170 described with reference to FIG. 12 is formed. Accordingly, the blocking insulating layer BIL may be in contact with top and bottom surfaces of the insulating layers 135. Alternatively, as illustrated in FIG. 21D, the tunnel insulating layer TIL may be formed on the inner sidewall of the through hole before the semiconductor pattern 141 is formed, and the charge storing layer CL and the blocking insulating layer BIL may be conformally and sequentially formed on the inner surface of the recess region 170.

According to example embodiments, the data storing layer DS may be confinedly disposed between the insulating layers 135 vertically adjacent to each other as illustrated in FIG. 21A. That is, the data storing layer DS may be confinedly disposed in each of the recess regions 170. Thus, the data storing layers DS in the recess regions 170 may be separated from each other. As a result, it is possible to limit (and/or prevent) charges stored in the data storing layer DS from being spread into neighboring data storing layers DS.

According to example embodiments, after the conductive patterns 175 are formed, impurity ions may be implanted into the substrate 10 under the trenches to form impurity regions used as the common source lines CSL, as illustrated in FIG. 3. Due to the shape of the trench, the impurity region may be a line shape extending in one direction in a plan view. The impurity region may have a conductivity type different from of the conductivity type of the substrate 10. Additionally, a gate separation insulating layer may be formed on the impurity region to fill the trench.

Figure 14:
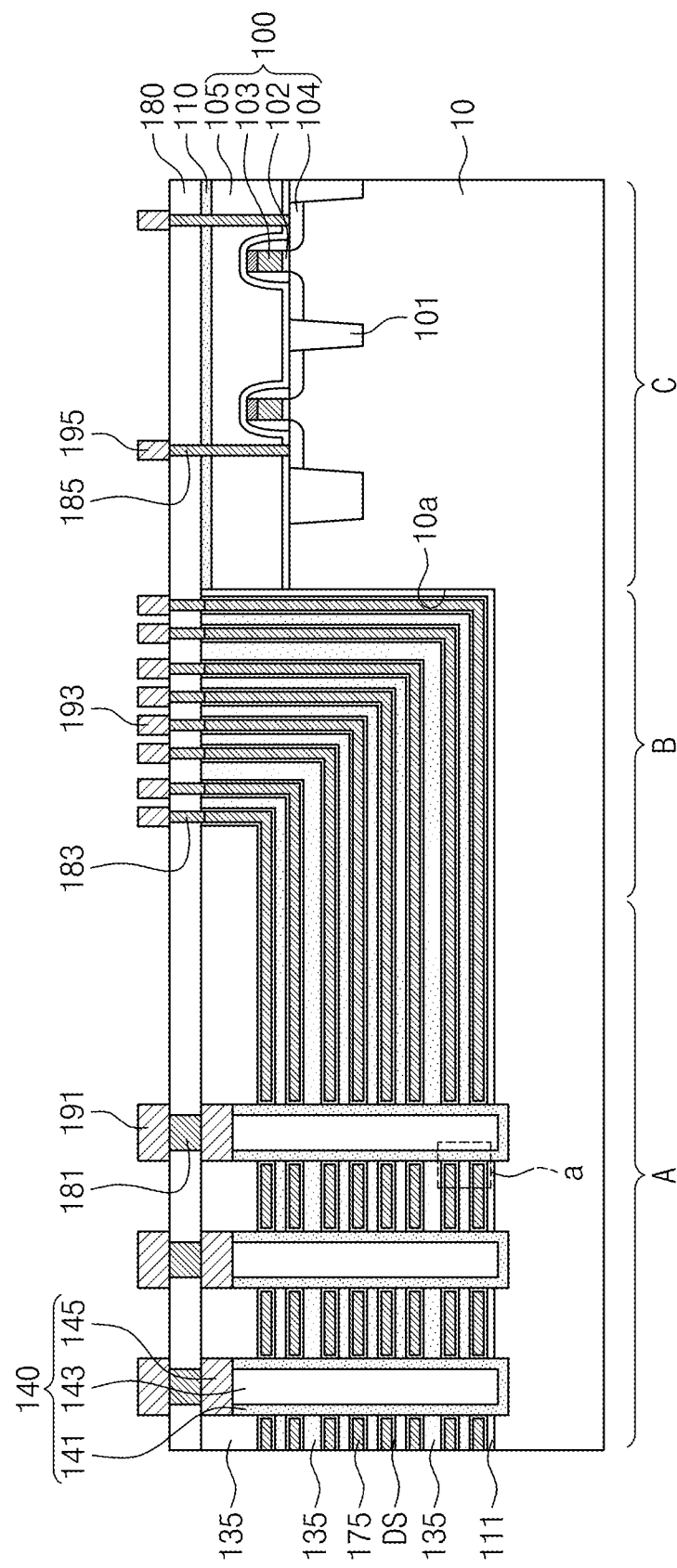

Referring to FIG. 14, an interconnection structure may be formed on the resultant structure where the conductive patterns 175.

The interconnection structure may include first contact plugs 181 respectively connected to top ends of the channel structures 140 in the cell array region A, second contact plugs 183 respectively connected to the conductive patterns 175 in the connection region B, and third contact plugs 185 connected to the peripheral circuits in the peripheral circuits region C. Additionally, the interconnection structure may include bit lines 191 connected to the first contact plugs 181 and crossing over the conductive patterns 175, connecting wires 193 connected to the contact plugs 183, and peripheral wires 195 connected to the third contact plugs 185.

The first to third contact plugs 181, 183, and 185 may include a metallic material (e.g., tungsten). In this case, forming the first to third contact plugs 181, 183, and 185 may include: sequentially forming a barrier metal layer (e.g., metal nitride) and a metal layer (e.g., tungsten). According to example embodiments, the first to third contact plugs 181, 183, and 185 may be formed simultaneously by the same process. According to example embodiments, since the top surface of the extending portions of the conductive patterns 175 in the connection region B are disposed at substantially the same level from the top surface of the substrate 10, lengths of the second plugs 183 may be substantially the same as each other.

Figure 15:
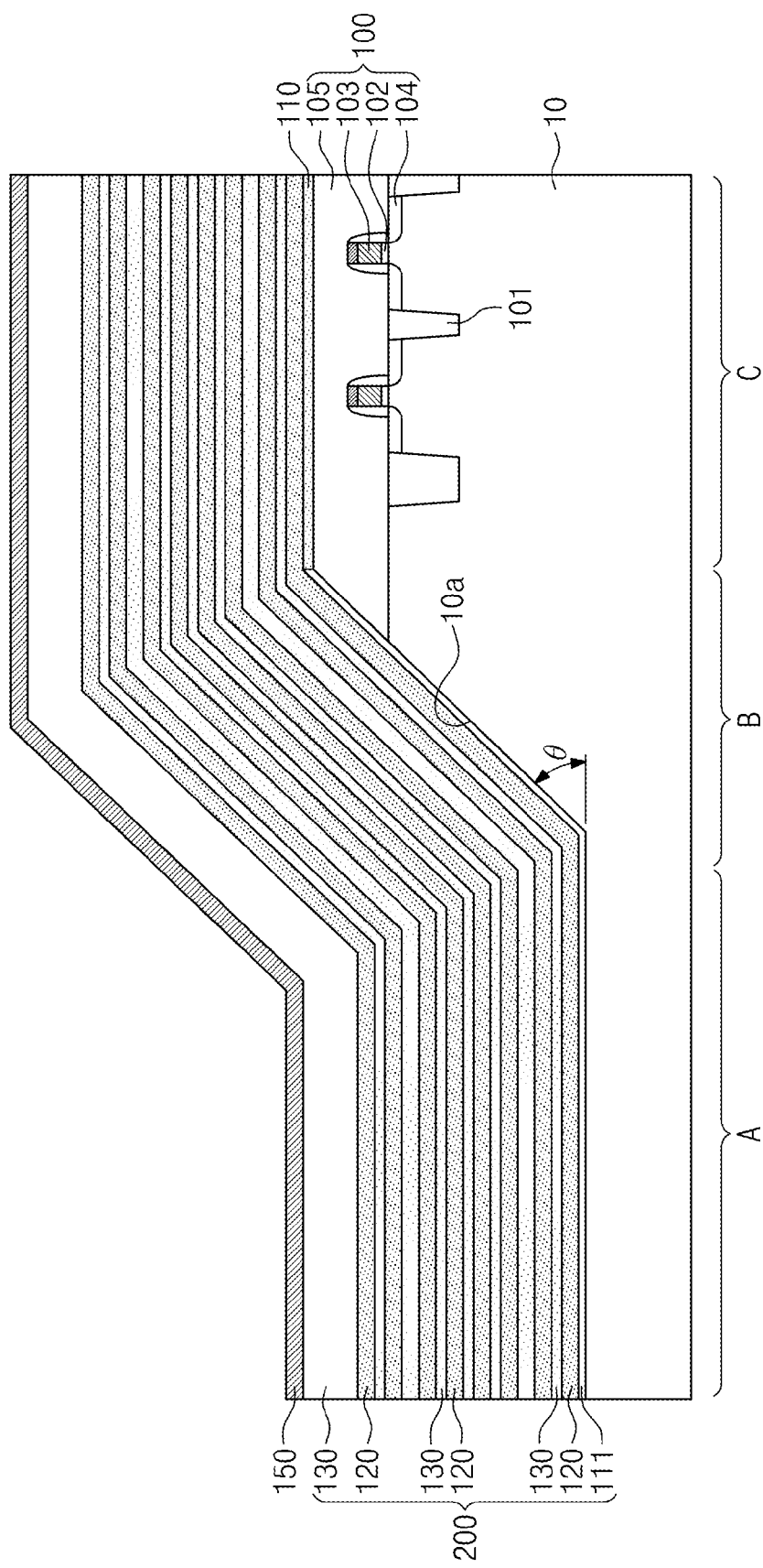
FIG. 15 is a cross-sectional view illustrating a method of manufacturing a 3D semiconductor device according to example embodiments of inventive concepts.

FIG. 15 is a cross-sectional view illustrating a method of manufacturing a 3D semiconductor device according to example embodiments of inventive concepts, where a gradient of the sidewall of the concave region 10a may be tilted.

Referring to FIG. 15, a concave region 10a formed at the substrate 10 may have a tilted sidewall with respect to the top surface of the substrate 10. For example, a tilted angle (θ) between the sidewall of the concave region 10a and the top surface of the substrate 10 may have a range of about 30 degrees to about 60 degrees.

Figure 16:
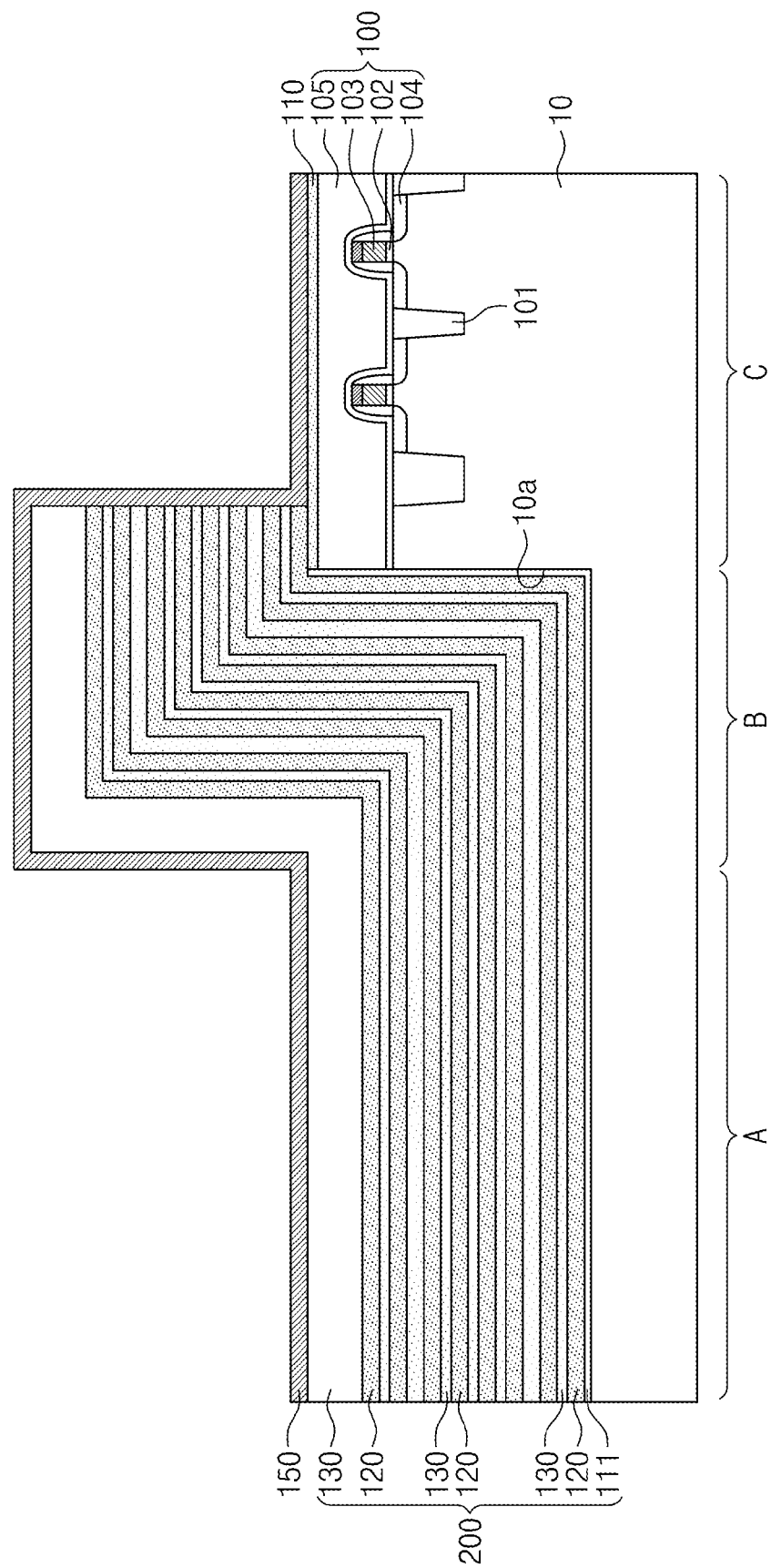
FIG. 16 is a cross-sectional view illustrating a method of manufacturing a 3D semiconductor device according to example embodiments of inventive concepts.

FIG. 16 is a cross-sectional view illustrating a method of manufacturing a 3D semiconductor device according to example embodiments of inventive concepts. According to example embodiments, after the locally protruded pillar portion is formed at the stacked layer structure 200, the planarization stop layer 150 may be formed.

In more detail, referring to FIG. 16, the stacked layer structure 200 may be conformally formed on the substrate 10 having the concave region 10a. As illustrated in FIG. 7, a portion of the stacked layer structure 200 in the peripheral circuits region C may be removed to form the protruded pillar portion higher than the top surface of the peripheral structure 100.

Next, the planarization stop layer 150 may be conformally formed on a surface of the stacked layer structure 200 having the pillar portion. Here, the planarization stop layer 150 may directly cover the surface of the planarization stop layer 150.

Subsequently, the first and second planarization processes may be performed on the stacked layer structure 200 as described with reference to FIGS. 9 and 10.

According to example embodiments, the planarization stop layer 150 formed on the cell array region A and the peripheral circuits region C may be used as the planarization end point in the second planarization process. The mold structure 210 may be formed in the concave region 10a by the second planarization process, and the top surfaces of the insulating layers 135 and the sacrificial layers 125 of the mold structure 210 in the connection region B may be exposed simultaneously at the same level.

Figure 17:
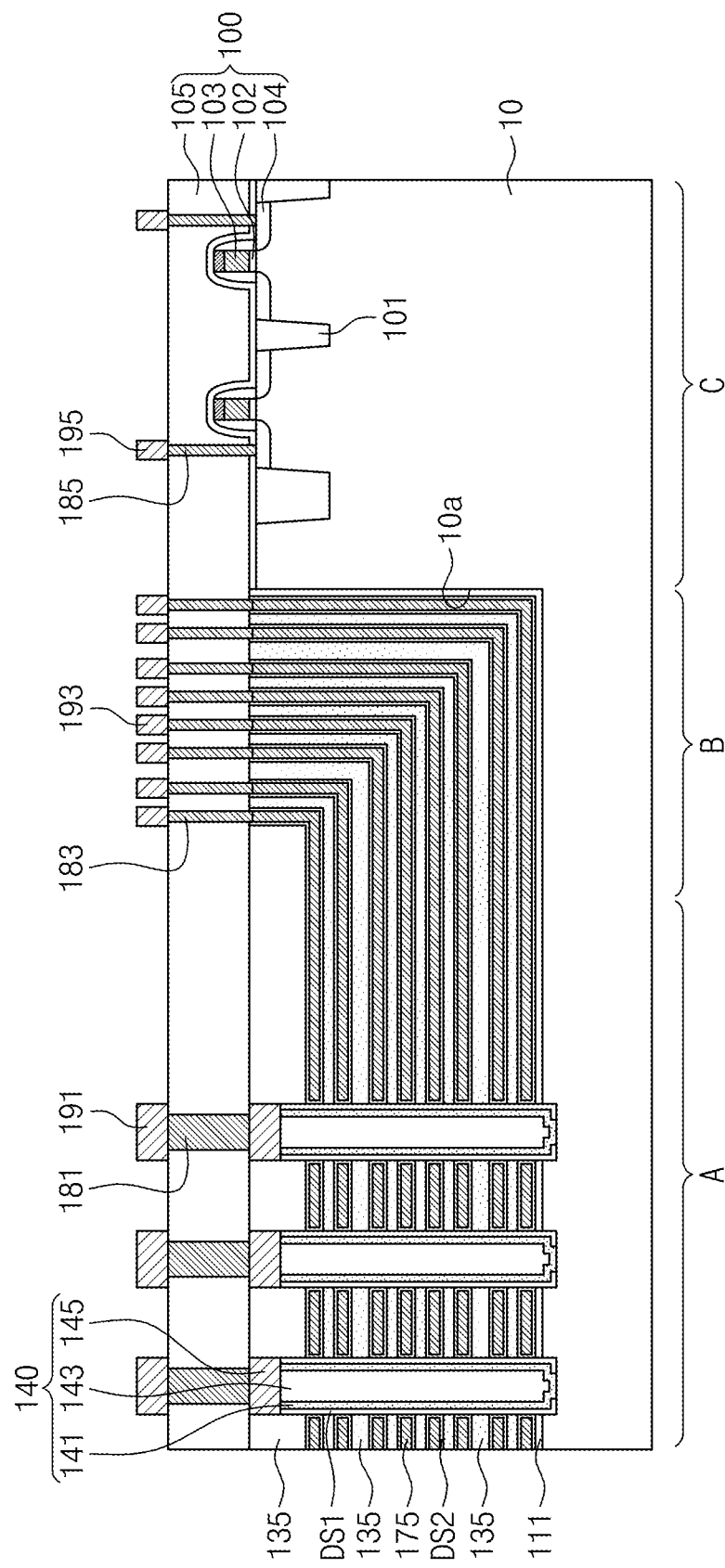
FIG. 17 is a cross-sectional view illustrating a 3D semiconductor device according to example embodiments of inventive concepts.

FIG. 17 is a cross-sectional view illustrating a 3D semiconductor device according to example embodiments of inventive concepts. According to example embodiments of inventive concepts, after the stacked layer structure is planarized to form the mold structure and then the channel structures and the conductive patterns are formed in the cell array region A, the peripheral structure 100 may be formed in the peripheral circuits region C. According to the example embodiments, in the planarization process of the stacked layer structure, top surfaces of insulating layers and sacrificial layers, which are exposed at the same level, may be coplanar with a top surface of the substrate of the peripheral circuits region C. Thus, top surfaces of the extending portions of the conductive patterns 175 may be disposed at a lower level than a top surface of the peripheral insulating layer 105.

Additionally, according to example embodiments illustrated in FIG. 17, a first data storing layer DS1 may be formed to cover inner sidewalls of the through holes before the channel structures 140 are formed. The first data storing layer DS1 may include the tunnel insulating layer TIL and the charge storing layer CL as illustrated in FIG. 21C. Alternatively, the first data storing layer DS1 may include the tunnel insulating layer TIL as illustrated in FIG. 21D.

Moreover, according to example embodiments, portions of the first data storing layer DS1, which are disposed on bottom surfaces of the through holes, may be removed for the contact of the channel structure 140 and the substrate 10 before the channel structure 140 is formed. For decreasing etch damage of the first data storing layer DS1, a protection spacer may be formed to cover the first data storing layer DS1 disposed on the inner sidewall of the through hole before the portion of the first data storing layer DS1 on the bottom surface of the through hole is removed.

Next, the channel structures 140 may be formed to fill the through holes having the first data storing layer DS1. Each of the channel structures 140 may be a semiconductor pattern 141 covering a bottom surface and a sidewall of the through hole having the first data storing layer DS1. According to example embodiments, the semiconductor pattern 141 may partially fill the through hole. In this case, a semiconductor pad 145 may be formed on the semiconductor pattern 141, and a filling insulating pattern 143 may be formed in an inner space confined by the semiconductor pattern 141 and the semiconductor pad 145.

Subsequently, after the recess regions 170 are formed as illustrated in FIG. 12, a second data storing layer DS2 and the conductive patterns 175 may be sequentially formed in the recess regions 170. The second data storing layer DS2 may be the blocking insulating layer BIL as illustrated in FIG. 21C. Alternatively, the second storing layer DS2 may include the charge storing layer CL and the blocking insulating layer BIL as illustrated in FIG. 21D.

Figure 18:
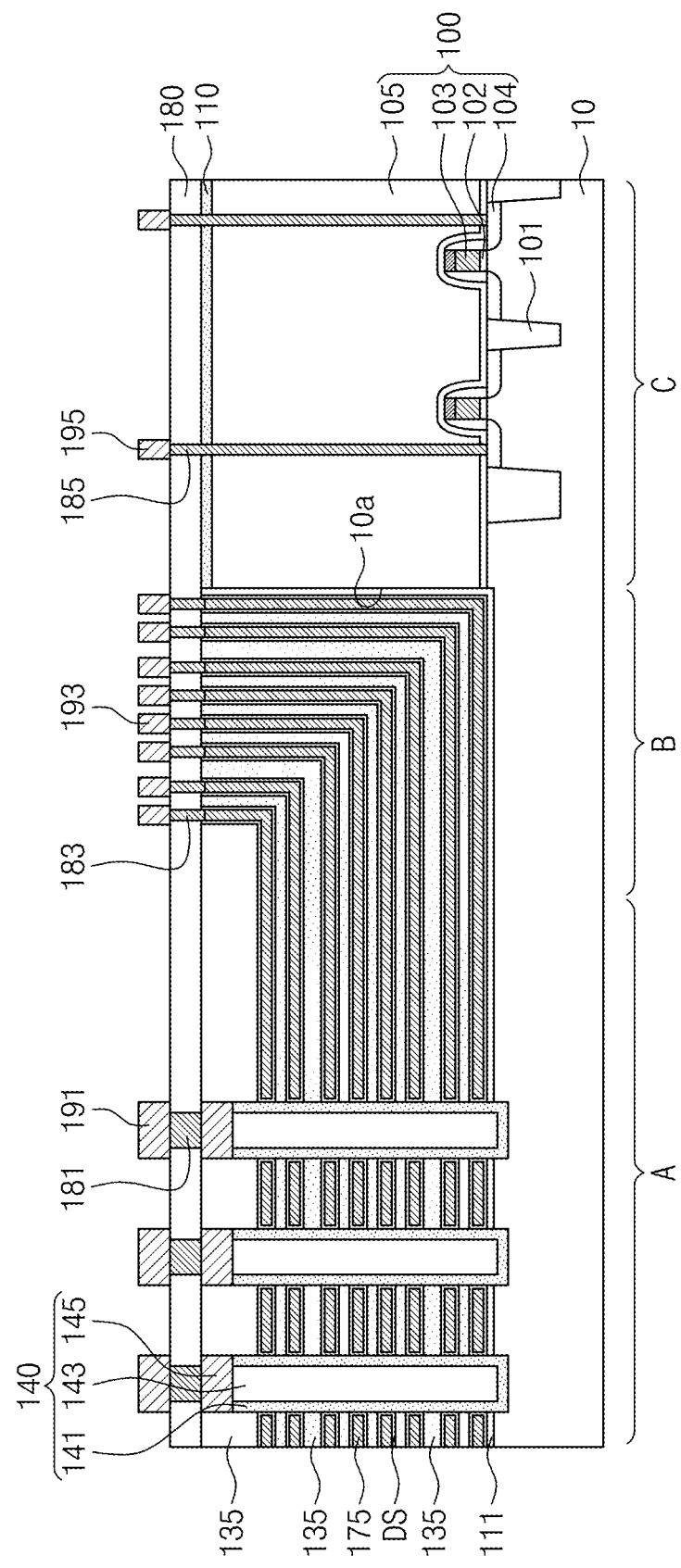
FIG. 18 is a cross-sectional view illustrating a 3D semiconductor device according to example embodiments of inventive concepts.

FIG. 18 is a cross-sectional view illustrating a 3D semiconductor device according to example embodiments of inventive concepts.

As illustrated in FIG. 18, a concave region 10a in which the mold structure 210 is formed may be defined by a peripheral insulating layer 105 formed in the peripheral circuits region C. According to example embodiments, a top surface of the substrate 10 in the cell array region A may be disposed at substantially the same level as a top surface of the substrate in the peripheral circuits region C. Additionally, a top surface of the peripheral insulating layer 105 covering the peripheral circuits in the peripheral circuits region C may be substantially coplanar with top surfaces of the extending portions of the conductive patterns 175.

Figure 19:
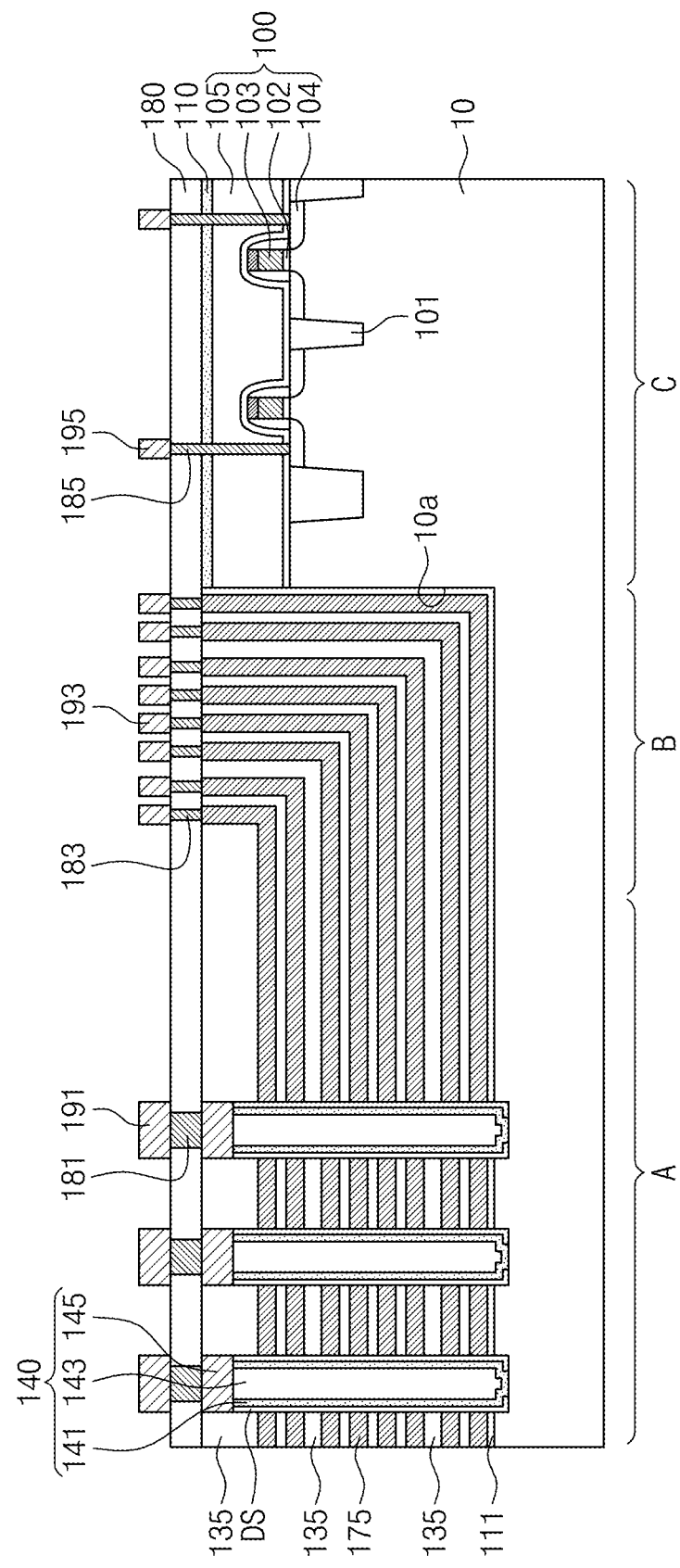
FIG. 19 is a cross-sectional view illustrating a 3D semiconductor device according to example embodiments of inventive concepts.

FIG. 19 is a cross-sectional view illustrating a 3D semiconductor device according to example embodiments of inventive concepts. As shown in FIG. 19, a stacked layer structure 200 formed on the substrate 10 having the concave region may include gate conductive layers 175 and insulating layers 135 which are alternately and repeatedly stacked.

According to example embodiments, the gate conductive layers 175 may be formed of poly-silicon doped with n-type or p-type impurities (boron or phosphorous), or amorphous silicon doped with n-type or p-type impurities (boron or phosphorous). The gate insulating layers 175 may be used as word lines WL01 to WL3 and selection lines GSL and SSL.

Additionally, a data storing layer DS may be disposed between the gate conductive layers 175 and the channel structure 140. The data storing layer DS may extend between the channel structure 140 and the insulating layer 135. According to example embodiments, the data storing layer DS may also include the tunnel insulating layer, the charge storing layer, and the blocking insulating layer.

A method of manufacturing a 3D semiconductor device according to example embodiments of inventive concepts will be described with reference to FIGS. 20A through 20F.

According to example embodiments of inventive concepts, after a lower mold structure 210 and lower channel structures 140 may be formed in the concave region 10a of the substrate as described with reference to FIGS. 5 through 11, an upper peripheral insulating layer 305 defining an upper concave region 305a and an upper stacked layer structure 300 may be sequentially formed on the lower mold structure 210 and the peripheral structure 100 which are planarized.

The upper stacked layer structure 300 may conformally cover the resultant structure where the upper peripheral insulating layer 305 like the stacked layer structure 200 described with reference to FIG. 5. The upper stacked layer structure 300 may include sacrificial layers 320 and insulating layers 330 which are alternately and repeatedly stacked.

The sacrificial layers 320 may be formed of a material having an etch selectivity with respect to the insulating layers 330. According to example embodiments, the sacrificial layers 320 may be formed of substantially the same material as the sacrificial layers 125 of the lower mold structure 210, and the insulating layers 330 may be formed of substantially the same material as the insulating layer 135 of the lower mold structure 210. For example, the insulating layers 330 may be formed of silicon oxide layers and the sacrificial layers 320 may be formed of silicon nitride layers.

The upper peripheral insulating layer 305 may be formed of one of materials (e.g., silicon oxide) having an etch selectivity with respect to the sacrificial layers 320. The upper peripheral insulating layer 305 may cover the top surfaces of the extending portions of the sacrificial layers 125 and the insulating layers 135 in the lower mold structure 210.

According to example embodiments, a thickness of the upper peripheral insulating layer 305 may be greater than a deposition thickness of the upper stacked layer structure 300. In this case, a portion (e.g., a portion in the cell array region A) of the upper stacked layer structure 300 may have a top surface lower than a top surface of the upper peripheral insulating layer 305.

A planarization stop layer 150 may further be formed on the resultant structure where the upper stacked layer structure 300. The planarization stop layer 150 may be formed of at least one of materials having an etch selectivity with respect to the sacrificial layers 320 and the insulating layers 330 as described with reference to FIG. 6. For example, the planarization stop layer 150 may be formed of a ploy-silicon layer as described with reference to FIG. 6.

Figure 20B:
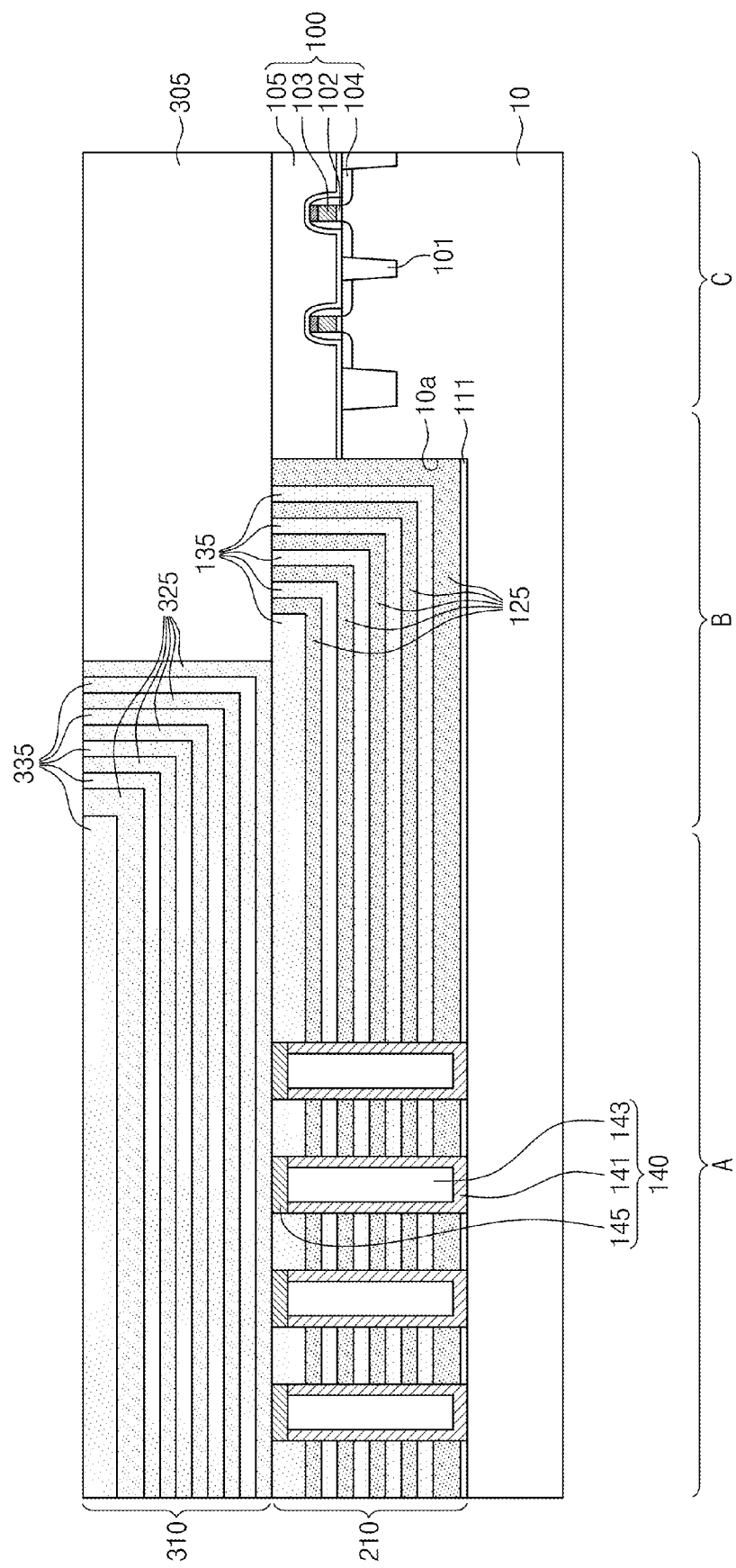

Referring to FIG. 20B, the upper stacked layer structure 300 may be planarized to form an upper mold structure 310.

The method of planarizing the upper stacked layer structure 300 may include: removing a portion of the upper stacked layer structure 300 in the peripheral circuits region C to form a pillar portion as described with reference to FIGS. 7 through 10; performing a first planarization process to remove the pillar portion locally protruded between the cell array region A and the peripheral circuits region C; and performing a second planarization process to expose top surfaces of the stacked layers of the upper stacked layer structure 300 simultaneously.

According to example embodiments, the planarization process of the upper stacked layer structure 300 may use the planarization stop layer 150 of the cell array region A and the top surface of the upper peripheral insulating layer 305 as a planarization end point.

The upper mold structure 310 formed as described above may include sacrificial layers 325 and insulating layers 335 which are alternately and repeatedly stacked in the upper concave region 305a.

Each of the sacrificial layers 325 and the insulating layers 335 of the upper mold structure 310 may have a horizontal portion parallel to the top surface of the substrate 10 and an extending portion parallel to a sidewall of the upper concave region 305a. After the upper stacked layer structure 300 is planarized, the extending portions of the sacrificial layers 325 and the insulating layers 335 of the upper mold structure 310 may have top surfaces exposed at substantially the same level. In other words, the upper mold structure 310 may be formed to have a thickness substantially equal to a thickness of the upper peripheral insulating layer 305.

The extending portions of the upper mold structure 310 may be formed to be adjacent to the cell array region A as compared with the extending portions of the lower mold structure 210. The top surfaces of the extending portions of the upper mold structure 310 may be far away from the top surface of the substrate to be exposed as compared with the top surfaces of the extending portions of the lower mold structure 210.

Figure 20C:
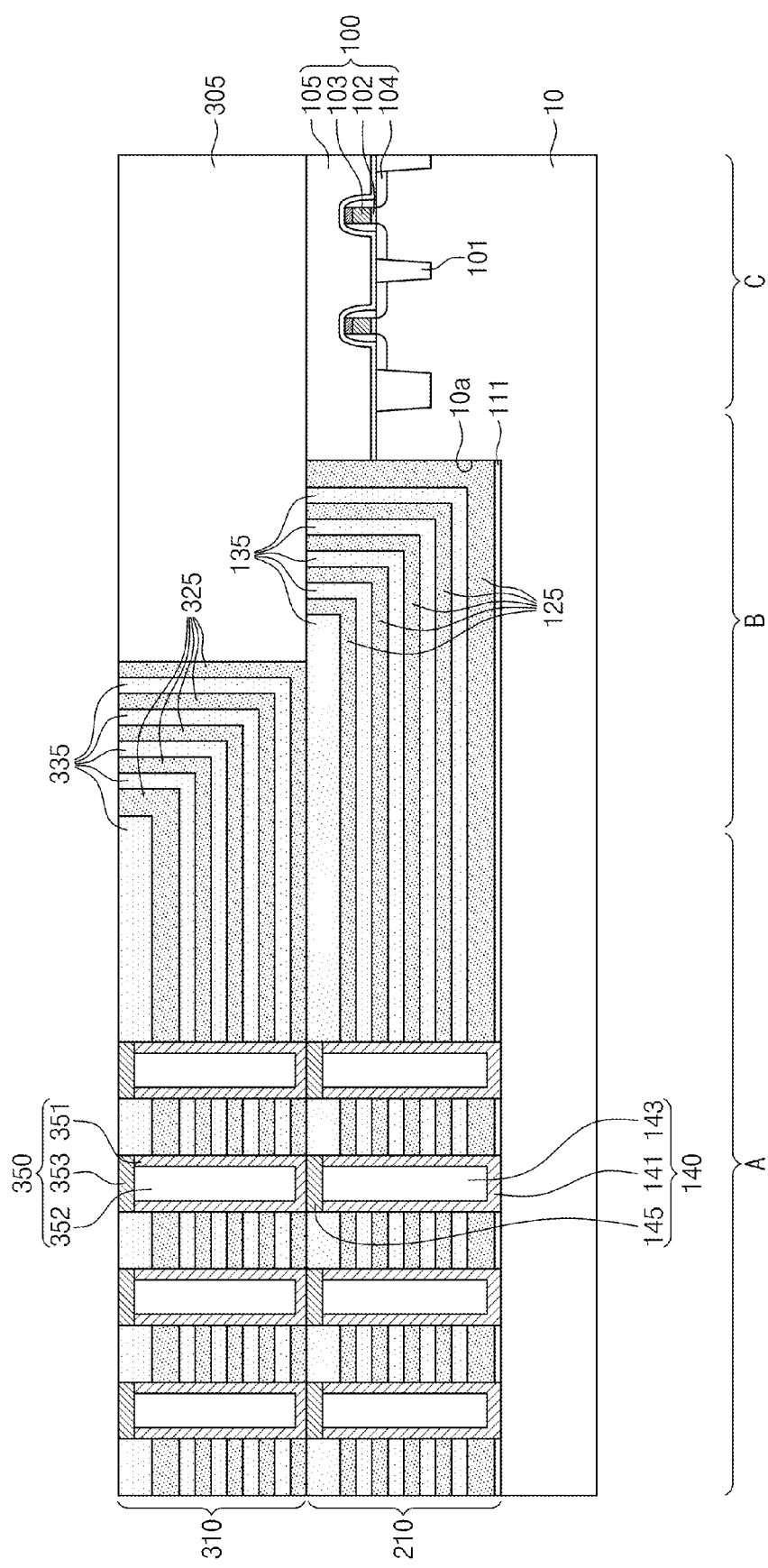

Referring to FIG. 20C, after upper through holes may be formed to penetrate the upper mold structure 310, upper channel structures 350 may be formed to fill the upper through holes, respectively. According to example embodiments, each of the upper through holes may be formed to expose a top surface of each of the lower channel structures 140. As a result, the upper through holes may be two-dimensionally arranged over the substrate 10 when viewed from a top view as the lower channel structures 140.

Each of the upper channel structures 350 may include an upper semiconductor pattern 351 covering a bottom surface and an inner sidewall of the upper through hole. According to example embodiments, the upper semiconductor pattern 351 may partially fill the upper through hole. In this case, an upper semiconductor pad 353 may be formed on the upper semiconductor pattern 351, and a filling insulating pattern 352 may be formed in an inner space confined by the upper semiconductor pattern 351 and the upper semiconductor pad 352.

According to example embodiments, the upper semiconductor pattern 351, the upper filling insulating pattern 352, and the upper semiconductor pad 353 may be formed by substantially the same methods and the same materials as those of the semiconductor pattern 141, the filling insulating pattern 143, and the semiconductor pad 145 described with reference to FIG. 11, respectively. However, example embodiments of inventive concepts are not limited thereto. The upper channel structure 350 may be formed by methods and materials different from those of the lower channel structure 140.

Figure 20D:
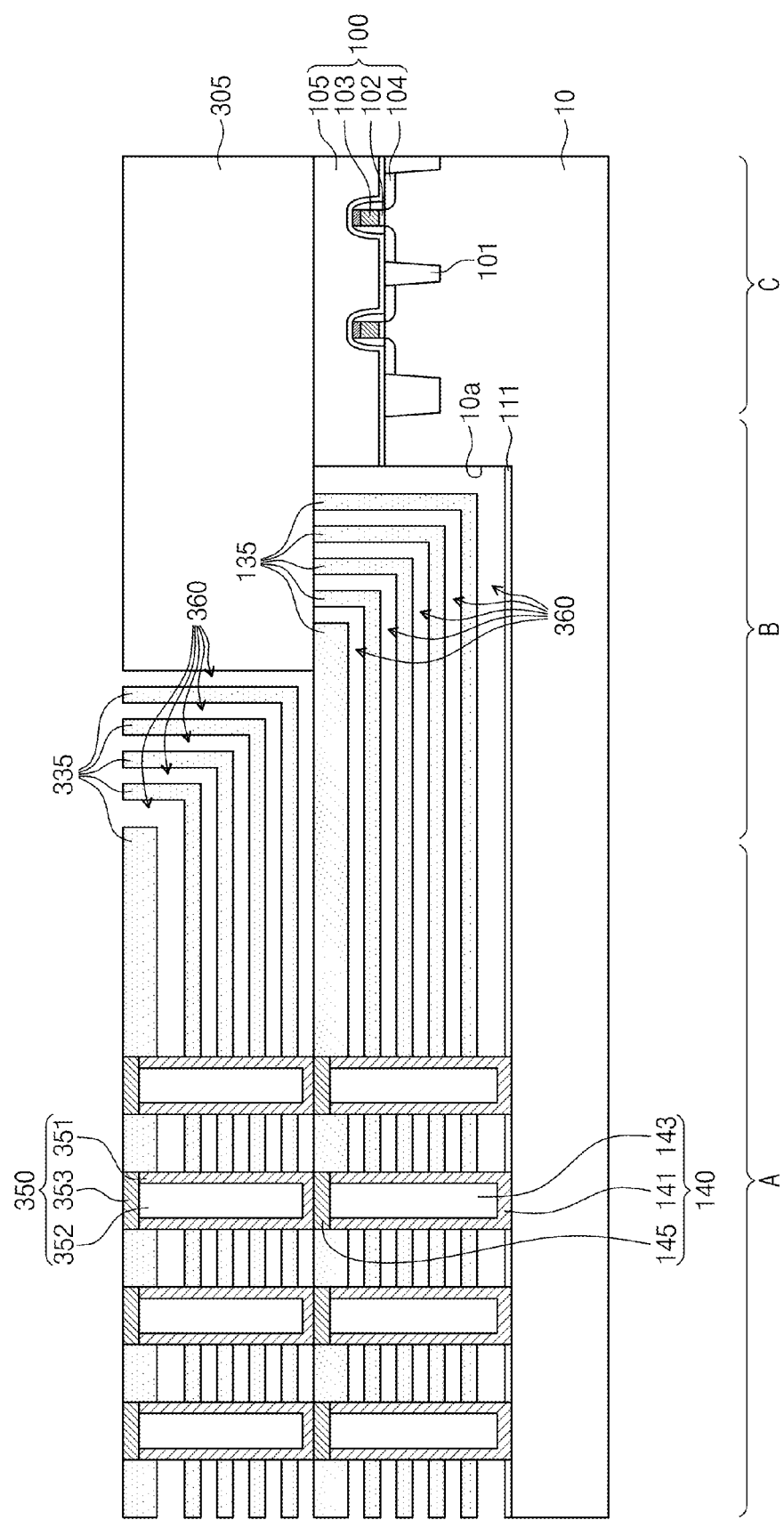

Referring to FIG. 20D, the lower and the upper mold structures 210 and 310 may be patterned to form trenches exposing the top surface of the substrate 10. The trenches may be formed to be spaced apart from the sidewalls of the lower and upper channel structures 140 and 350 and to extend in parallel. Thus, the sacrificial layers 125 and 325 and the insulating layers 135 and 335 may have sidewalls exposed by the trenches.

Subsequently, the sacrificial layers 125 and 325 exposed by the trenches may be selectively and horizontally etched to form recess regions 360 between the insulating layers. That is, the boundaries of the recess regions 360 may be confined by the top/bottom surfaces of the insulating layers 135 and 335, sidewalls of the lower and upper semiconductor patterns 141 and 351, and the trenches.

The method of forming the recess regions 360 may include: horizontally etching the sacrificial layers 125 and 325 using an etch recipe having an etch selectivity with respect to the insulating layers 135 and 335 and the lower and upper semiconductor patterns 141 and 351. For example, if the sacrificial layers 125 and 325 are silicon nitride layers and the insulating layers 135 and 335 are silicon oxide layers, the horizontal etch of the sacrificial layers 125 and 325 may be performed using an etch solution including phosphoric acid.

Since the recess regions 360 are formed by horizontally etching the sacrificial layers 125 and 325, the recess regions 360 may have horizontal portions parallel to the top surface of the substrate 10 and extending portions parallel to the sidewalls of the lower and upper concave regions 10a and 305a like the sacrificially layers 125 and 325.

Figure 20E:
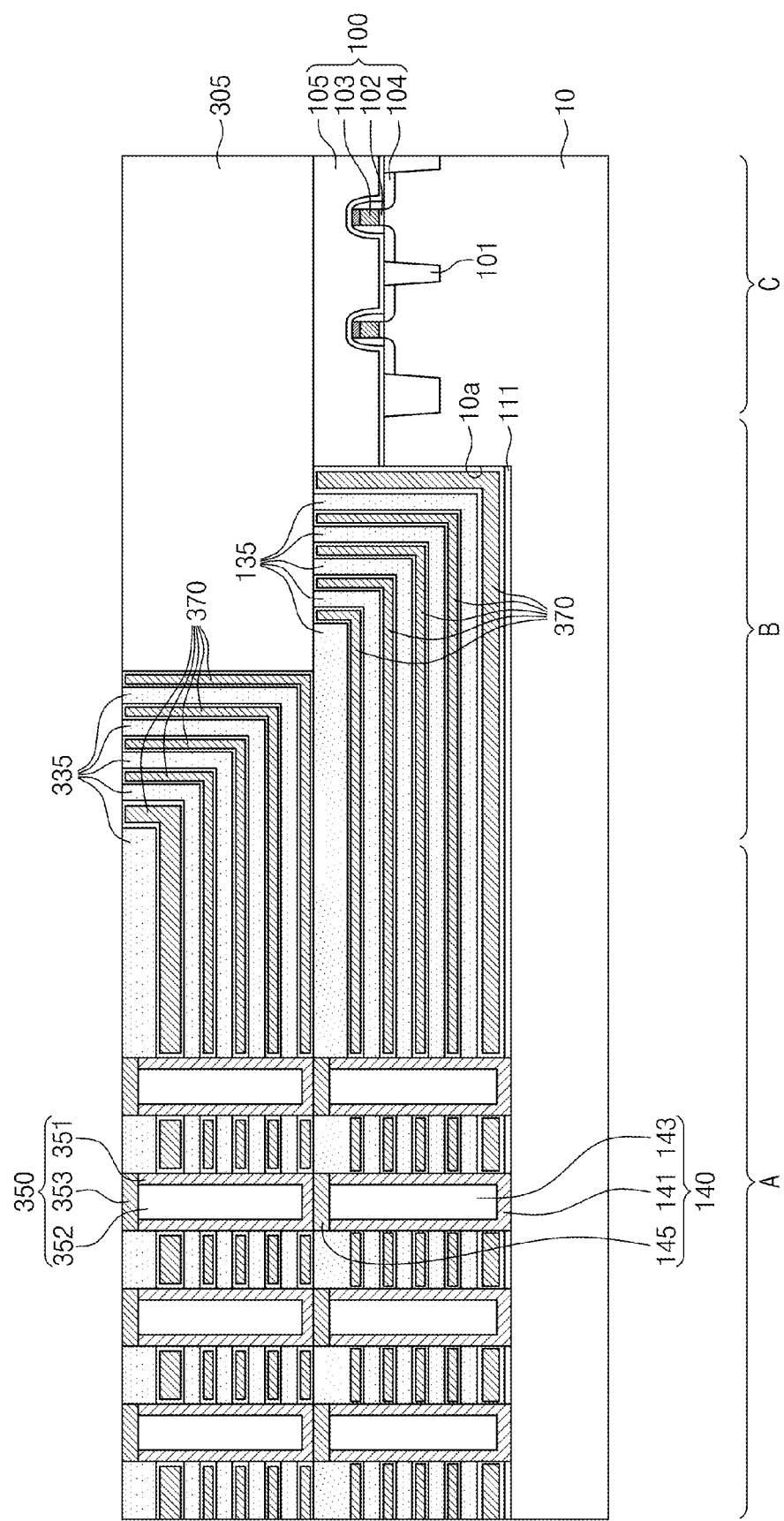

Referring to FIG. 20E, conductive patterns 370 may be formed in the recess regions 360, respectively.

The method of forming the conductive patterns 370 may include: sequentially forming a data storing layer and a conductive layer in the trenches and the recess regions 360; and removing the conductive layer in the trenches to form the conductive patterns 370 confinedly remaining in the recess regions 370, respectively. After the conductive layer in the trenches is removed, the trenches may be filled with one of insulating materials.

A process of removing the conductive layer in the trenches may include: anisotropically or isotropically etching the conductive layer. Since the conductive layer in the trenches is removed, the conductive layer is divided into the conductive patterns 370 vertically separated from each other. In other words, the conductive patterns 370 may be confinedly formed in the recess regions 360 to be used as electrodes changing the data stored in the data storing layer DS.

Since the conductive patterns 370 have shapes defined by the recess regions 360, like the recess regions 360 or the sacrificial layers 125 and 325, the conductive patterns 370 may have horizontal portions parallel to the top surface of the substrate 10 and extending portions parallel to the sidewalls of the lower and upper concave regions 10a and 305a. According to example embodiments described above, the extending portions of the conductive patterns 370 (hereinafter, referred to as "lower conductive patterns 370) in the recess regions 360 formed by removing the sacrificial layers 125 of the lower mold structure 210 may be far away from the cell array region A as compared with the extending portions of the conductive patterns 370 (hereinafter, referred to as "upper conductive patterns 370) in the recess regions 360 formed by removing the sacrificial layers 325 of the upper mold structure 310.

The extending portions of the lower conductive patterns 370 may have top surfaces exposed at substantially the same level from the top surface of the substrate 10, and the extending portions of the upper conductive patterns 370 may have top surfaces exposed at substantially the same level from the top surface of the substrate. The exposed top surfaces of the extending portions of the upper conductive patterns 370 may be far away from the top surface of the substrate 10 as compared with the exposed top surfaces of the extending portions of the lower conductive patterns 370.

Figure 20F:
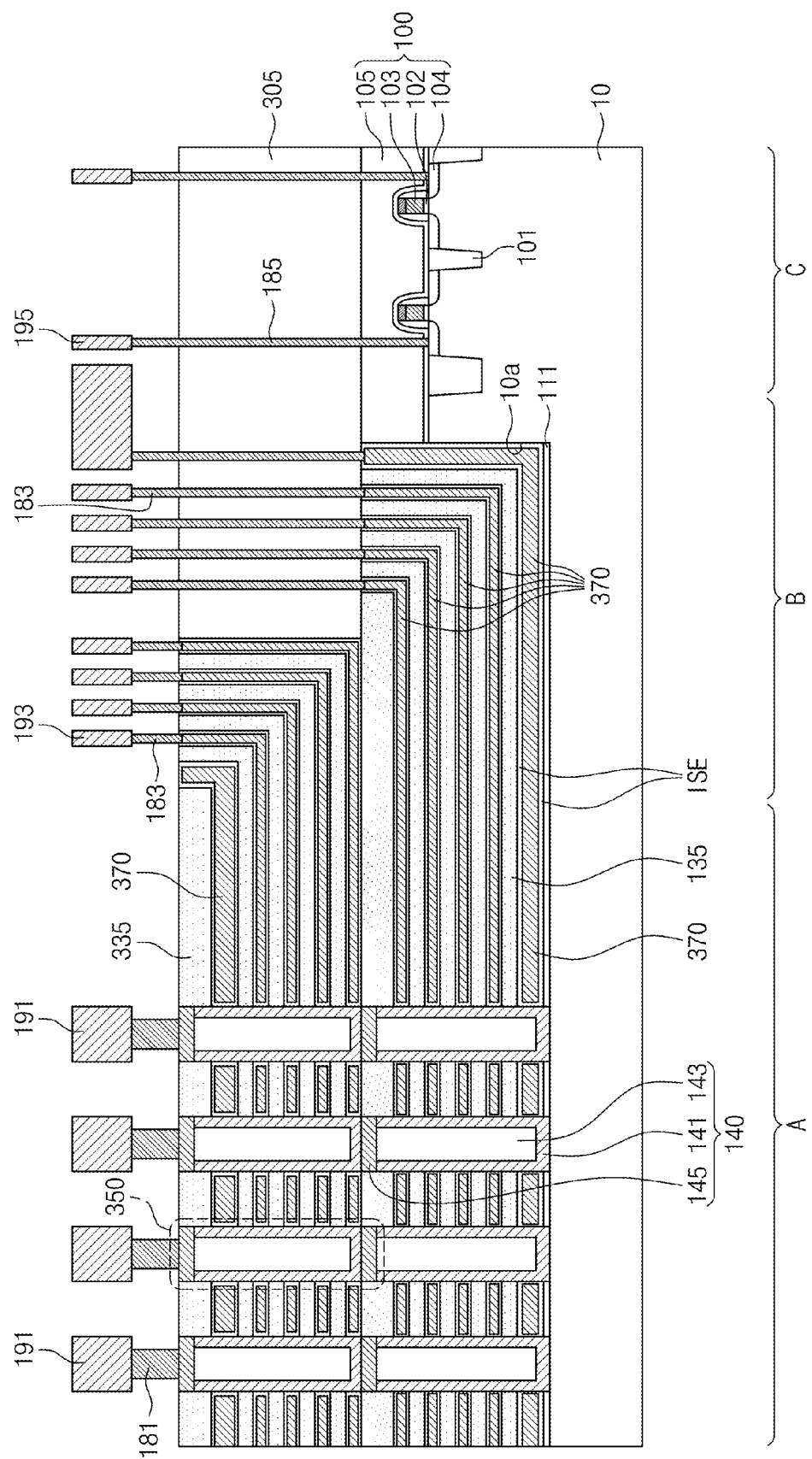

Referring to FIG. 20F, an interconnection structure may be formed on the resultant structure where the conductive patterns 370 are formed. The interconnection structure may include first contact plugs 181 connected to top ends of the upper channel structures 350, bit lines 191 connected to the first contact plugs 181, second contact plugs 183 connected to the extending portions of the conductive patterns 370, connecting wires 193 connected to the second contact plugs 183, third contact plugs 185 connected to the peripheral circuits, and peripheral wires 195 connected to the third contact plugs 185.

According to example embodiments, the second contact plugs 183 connected to the extending portions of the upper conductive patterns 370 may be formed simultaneously with the first contact plugs 181 connected to the top ends of the upper channel structures 350 using the same process.

Additionally, the second contact plugs 183 connected to the extending portions of the lower conductive patterns 370 may be formed simultaneously with the third contact plugs 185 connected to the peripheral circuits using the same process.

The semiconductor devices described above may be encapsulated using various packaging techniques. For example, the semiconductor devices according to example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 22:
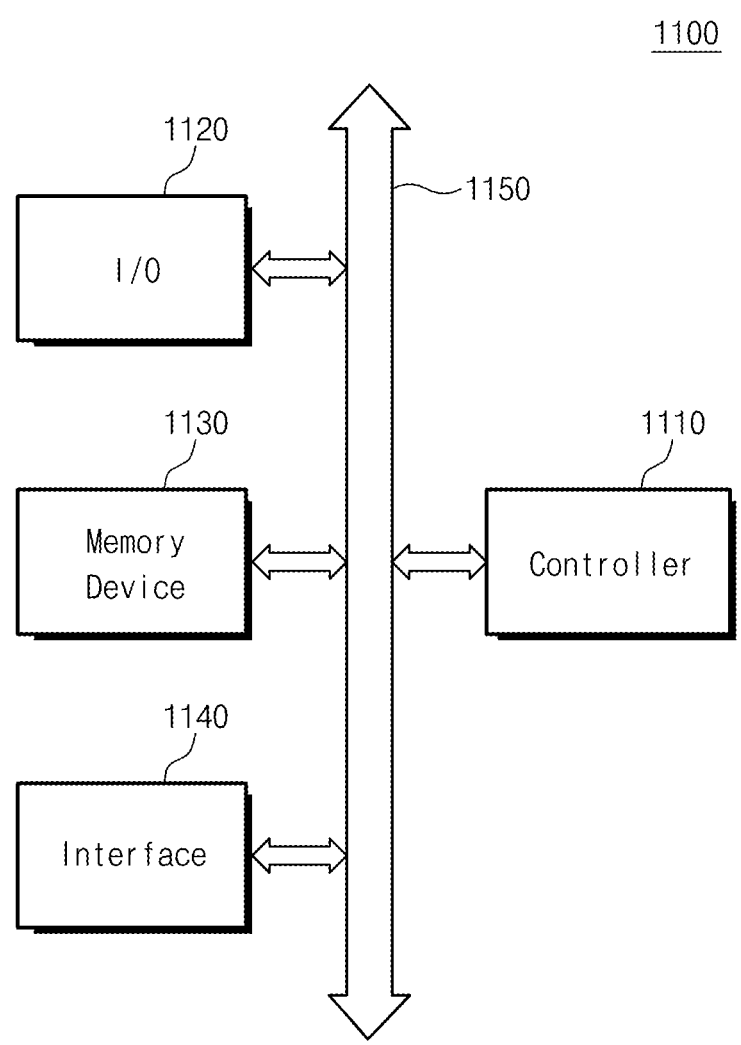
FIG. 22 is a schematic block diagram illustrating an example of information processing systems including 3D semiconductor devices according to example embodiments of inventive concepts.

FIG. 22 is a schematic block diagram illustrating an example of information processing systems including 3D semiconductor devices according to example embodiments of inventive concepts.

Referring to FIG. 22, an information processing system 1100 can be applied to a PDA (personal digital assistant), a portable computer, a web tablet, a wireless phone, a mobile phone, a digital music player, a memory card and/or all the devices that can transmit and/or receive data in a wireless communication environment.

The information processing system 1100 includes a controller 1110, an input/output device 1120 such as a keypad and a display device, a memory 1130, an interface 1140 and a bus 1150. The memory 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory 1130 may be used to store an instruction executed by the controller 1110. The input/output device 1120 can receive data or a signal from the outside of the information processing system 1100 or transmit data or a signal to the outside of the information processing system 1100. For example, the input/output device 1120 may include a keyboard, a keypad and/or a displayer.

The memory 1130 includes the 3D semiconductor device according to example embodiments of the inventive concept. The memory 1130 may further include a different kind of memory, a volatile memory device capable of random access and various kinds of memories.

The interface 1140 transmits data to a communication network or receives data from a communication network.

Figure 23:
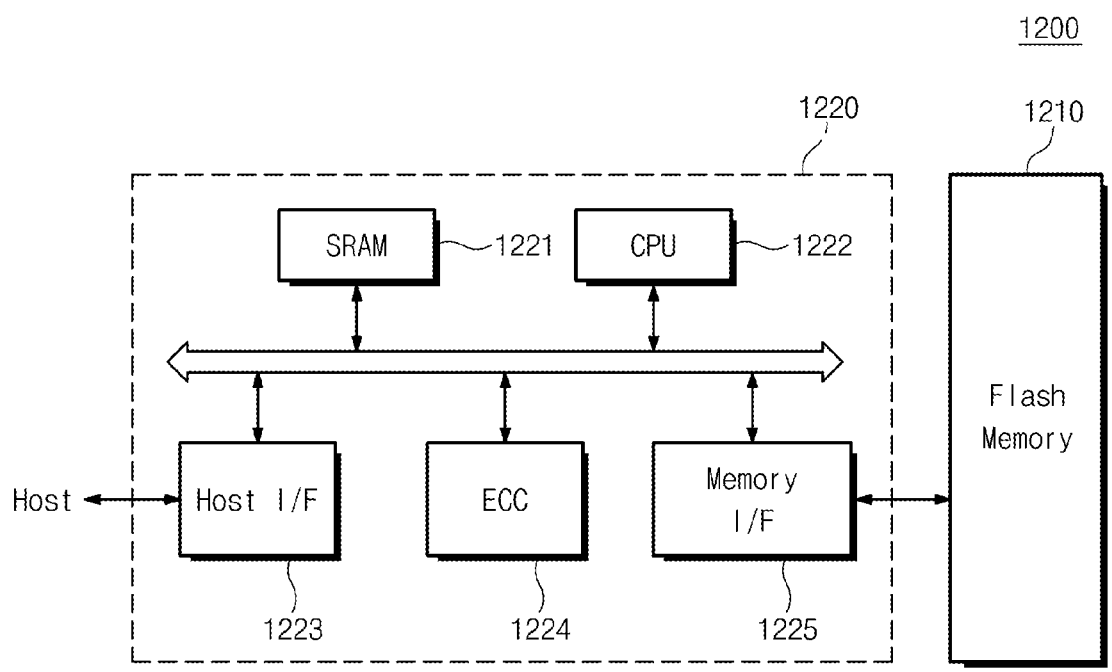
FIG. 23 is a schematic block diagram illustrating an example of memory cards including 3D semiconductor devices according to example embodiments of inventive concepts.

FIG. 23 is a schematic block diagram illustrating an example of memory cards including 3D semiconductor devices according to example embodiments of inventive concepts.

Referring to FIG. 23, the memory card 1200 for supporting a storage capability of a large capacity is fitted with a flash memory device 1210. The flash memory device 1210 includes the 3D semiconductor device according to example embodiments of the inventive concept. The memory card 1200 according to example embodiments of inventive concept includes a memory controller 1220 controlling every data exchange between a host and the flash memory device 1210.

A static random access memory (SRAM) 1221 is used as an operation memory of a processing unit 1222. A host interface 1223 includes data exchange protocols of a host to be connected to the memory card 1200. An error correction block 1224 detects and corrects errors included in data readout from a multi bit flash memory device 1210. A memory interface 1225 interfaces with the flash memory device 1210 of example embodiments of inventive concepts. The processing unit 1222 performs every control operation for exchanging data of the memory controller 1220. Even though not depicted in drawings, it is apparent to one of ordinary skill in the art that the memory card 1200 according to example embodiments of inventive concepts can further include a ROM (not shown) storing code data for interfacing with the host.

Figure 24:
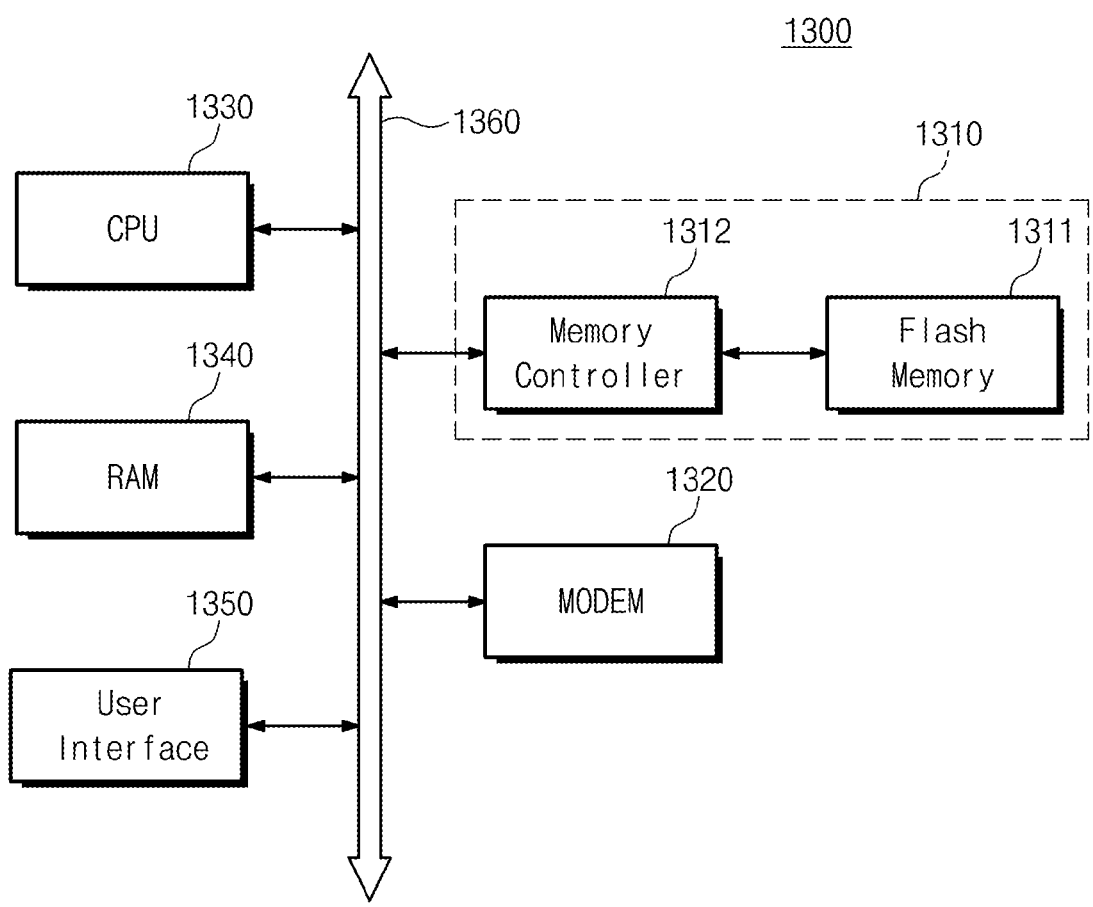
FIG. 24 is a schematic block diagram illustrating another example of information processing systems including 3D semiconductor devices according to example embodiments of inventive concepts.

FIG. 24 is a schematic block diagram illustrating another example of information processing systems including 3D semiconductor devices according to example embodiments of inventive concepts.

Referring to FIG. 11, a flash memory system 1310 is built in a data processing system such as a mobile product or a desk top computer. The flash memory system 1310 includes the 3D semiconductor device according to example embodiments of the inventive concept. The data processing system 1300 according to the inventive concept includes the flash memory system 1310 and a modem 1320, a central processing unit 1330, a RAM, a user interface 1350 that are electrically connected to a system bus 1360. The flash memory system 1310 may be constructed so as to be identical to the memory card system or the flash memory card system described above. The flash memory system 1310 stores data processed by the central processing unit 1330 or data inputted from an external device. The flash memory system 1310 may include a solid state disk (SSD) and in this case, the data processing system 1310 can stably store huge amounts of data in the flash memory system 1310. As reliability is improved, the flash memory system 1310 can reduce resources used to correct errors, thereby providing a high speed data exchange function to the data processing system 1300. Even though not depicted in the drawings, it is apparent to one of ordinary skill in the art that the data processing unit 1300 according to example embodiments of inventive concepts can further include an application chipset, a camera image processor (CIS) and/or an input/output device.

According to the methods of manufacturing a 3D semiconductor device described above, for forming a plurality of memory cells vertically stacked in the cell array region, the stacked layer structure including a plurality of thin layers may be formed on the substrate having the concave region. A height of the top surface of the stacked layer structure in the cell array region may be different from that of the top surface of the stacked layer structure in the peripheral circuits region by the concave region formed in the substrate. Thus, the process planarizing the top surface of the stacked layer structure is performed.

Before the planarization process is performed, since a portion of the stacked layer structure in the peripheral circuits region is anisotropically etched, the process burden of the subsequent planarization can decrease.

Additionally, before the planarization process is performed, the planarization stop layer may be conformally formed on the stacked layer structure. Thus, when the stacked layer structure is planarized, it is possible to limit (and/or prevent) the thickness of the stacked layer structure in the cell array region from being changed.

Moreover, since the thin layers constituting the planarized stacked layer structure may have top surface disposed at substantially the same level from the top surface of the substrate, it is possible to secure a process margin for the formation of the contact plugs and wires selectively connected to the thin layers.

While some example embodiments have been particularly shown and described, it will be understood by one of ordinary skill in the art that variations in form and detail may be made therein without departing from the spirit and scope of the claims.

What is claimed is:

1. A method of manufacturing a three-dimensional semiconductor device, comprising:
    forming a peripheral structure on a peripheral circuits region of a substrate,
        the peripheral structure including peripheral circuits;
    recessing a cell array region of the substrate to form a concave region in the substrate,
        the concave region having a bottom surface lower than a top surface of the peripheral structure;
    forming a stacked layer structure conformally covering the substrate in which the concave region is formed,
        the stacked layer structure including a plurality of layers sequentially stacked, and
        the stacked layer structure having a lower top surface in the cell array region of the substrate compared to a top surface of the stacked layer structure in the peripheral circuits region of the substrate;
    forming a planarization stop layer that conformally covers the stacked layer structure; and
    planarizing the stacked layer structure using the planarization stop layer in the cell array region as a planarization end point to expose top surfaces of the layers between the cell array region and the peripheral circuits region simultaneously with a top surface of the peripheral structure.

2. The method of claim 1, wherein the planarizing the stacked layer structure comprises:
    anisotropically etching a portion of the stacked layer structure in the peripheral circuits region to form a pillar portion locally protruded between the cell array and the peripheral circuits regions of the substrate;
    performing a first chemical mechanical polishing process to remove the pillar portion of the stacked layer structure; and
    performing a second chemical mechanical polishing process using the planarization stop layer of the cell array region as the planarization end point to expose the top surfaces of the layers and the top surface of the peripheral structure simultaneously.

3. The method of claim 2, further comprising:
    forming a buffer insulating layer on the planarization stop layer before performing the first planarization process,
    wherein the performing the first chemical mechanical planarization process exposes a portion of the stacked layer structure between the cell array region and the peripheral circuits region.

4. The method of claim 1, wherein
    the planarization stop layer includes a poly-silicon layer, and
    a removal rate of the poly-silicon layer is less than a removal rate of the stacked layer structure in during the planarizing the stacked layer structure.

5. The method of claim 1, further comprising:
    forming a peripheral planarization stop layer covering the top surface of the peripheral structure before forming the stacked layer structure,
    wherein the planarizing the stacked layer structure uses the peripheral planarization stop layer as a planarization end point in the peripheral circuits region.

6. The method of claim 1, wherein forming the peripheral structure comprises:
    forming the peripheral circuits on the substrate of the peripheral circuits region; and
    forming a peripheral insulating layer over the peripheral circuits.

7. The method of claim 1, wherein
    the planarizing the stacked layer structure comprises forming a mold structure in the concave region;
    the mold structure includes the layers of which the top surfaces are exposed simultaneously,
    each of the layers constituting the mold structure has a horizontal portion substantially parallel to a top surface of the substrate, and an extending portion extending from the horizontal portion and substantially parallel to a sidewall of the concave region, and
    the extending portions of the layers have top surfaces at substantially equal levels from the top surface of the substrate.

8. The method of claim 7, further comprising:
    forming channel structures in the cell array region,
    each of the channel structures including,
        a semiconductor pattern penetrating the mold structure to be connected to the substrate, and
        a semiconductor pad on the semiconductor pattern.

9. The method of claim 8, wherein
    the forming the stacked layer structure comprises alternately and repeatedly stacking insulating layers and sacrificial layers; and
    the method further comprises,
        removing the sacrificial layers to form recess regions between the insulating layers, after forming the channel structures, forming a data storing layer in the recess regions, and forming conductive patterns in the recess regions in which the data storing layer is formed, respectively.

10. The method of claim 8, wherein
the forming the stacked layer structure comprises alternately and repeatedly stacking conductive layers and insulating layers; and
the method further comprises: forming a data storing layer between the channel structure and the mold structure.

11. A method of manufacturing a three-dimensional semiconductor device, comprising:
forming a concave region in a substrate including a cell array region and a peripheral circuits region,
the concave region having a bottom surface parallel to a top surface of the substrate and a sidewall between the cell array region and the peripheral circuits region;
forming a stacked layer structure conformally covering the bottom surface and the sidewall of the concave region,
the stacked layer structure including a plurality of layers sequentially stacked, and
the stacked layer structure having a lowest top surface over the cell array region and a highest top surface over the peripheral circuits region;
forming a planarization stop layer conformally covering the stacked layer structure; and
planarizing the stacked layer structure using the planarization stop layer in the cell array region as a planarization end point to expose top surfaces of the layers between the cell array region and the peripheral circuits region simultaneously with a top surface of the peripheral structure.

12. The method of claim 11, wherein the planarizing the stacked layer structure comprises:
removing a portion of the stacked layer structure to form a pillar portion locally protruded between the cell array region and the peripheral circuits region of the substrate;
performing a first chemical mechanical planarization process to remove the pillar portion of the stacked layer structure; and
performing a second chemical mechanical planarization process using the planarization stop layer of the cell array region as the planarization end point to expose the top surfaces of the layers and the peripheral structure simultaneously.

13. The method of claim 11, wherein the forming the concave region comprises:
forming a peripheral structure including peripheral circuits on the peripheral circuits region of the substrate; and
recessing a top surface of the cell array region to be lower than a top surface of the peripheral structure.

14. The method of claim 11,
wherein the forming the concave region comprises recessing a top surface of the cell array region to be lower than a top surface of the substrate of the peripheral circuits region; and
the method, further comprises forming a peripheral structure including peripheral circuits on the peripheral circuits region of the substrate after the planarizing the stacked layer structure.

15. The method of claim 11, wherein the forming the concave region comprises:
forming the peripheral circuits on the substrate of the peripheral circuits region; and
forming a peripheral insulating layer over the peripheral circuits,
the peripheral insulating layer defining at least part of the sidewall of the concave region.

16. A method for manufacturing a three-dimensional semiconductor device comprising:
forming a stacked layer structure that conformally covers at least a first and a second surface of a substrate and at least part of a peripheral structure on a peripheral circuits region of a substrate,
the second surface of the substrate defining a sidewall between the first surface of the substrate and a top surface of the peripheral circuits region of the substrate,
the stacked layer structure including a plurality of layers sequentially stacked, and
the stacked layer structure having a top surface over the first surface of the substrate that is lower compared to a top surface of the stacked layer structure over the peripheral structure;
forming a planarization stop layer that conformally covers the stacked layer structure; and
planarizing the stacked layer structure using at least part of the planarization stop layer as a planarization end point to expose top surfaces of segments of the layers extending parallel to the second surface of the substrate.

17. The method of claim 16, wherein
the first surface of the substrate forms a first angle with the second surface of the substrate,
the second surface of the substrate forms a second angle with the top surface of the peripheral circuits region of the substrate, and
the top surface of the peripheral circuits region of the substrate is at a higher level compared to the first surface of the substrate.

18. The method of claim 16, further comprising:
forming an oxide layer that conformally covers the first and second surfaces of the substrate and a sidewall of the peripheral structure before the forming the stacked layer structure.

19. The method of claim 16, wherein
the peripheral structure includes a peripheral planarization stop film;
the stacked structure includes,
a first portion of layers parallel to the first surface of the substrate,
a second portion of layers extending from the first portion of layers in a direction parallel to the second surface of the substrate, and
a third portion of layers extending from the second portion of layers to over the peripheral planarization film;
the planarization stop layer includes,
a first planarization stop portion over the first portion of layers,
a second planarization stop portion extending from the first planarization stop portion in the direction parallel to the second surface of the substrate, and
a third planarization stop portion extending from the second planarization stop portion to over the third portion of layers; and
the planarizing the stacked structure includes,
partially removing the third planarization stop portion and partially removing the third portion of layers to form a remaining third planarization stop portion and a remaining third portion of layers,
the remaining third planarization stop portion and the remaining third portion of layers partially exposing the peripheral planarization stop film,
forming a buffer insulating layer over the first planarization stop portion, the second planarization stop portion, the remaining third planarization stop portion, and the peripheral planarization stop film, the buffer insulating layer including,
- a first buffer insulating layer portion over the first planarization stop portion,
- a second buffer insulating layer portion that conformally covers the second planarization stop portion, the remaining third planarization stop portion, and the remaining third portion of layers, and
- a third buffer insulating layer portion over the part of the partially exposed peripheral planarization stop film, performing a first planarization process that removes the second buffer insulating layer portion, the remaining third planarization stop layer, at least one layer of the remaining third portion of layers to form a leftover third portion of layers, partially removes the second portion of layers to form a remaining second portion of layers, and partially removes the second planarization stop portion to form a remaining planarization stop layer,
   the remaining planarization stop layer including the first planarization stop portion, and performing a second planarization process that removes the first and third buffer insulating layer portions, the remaining planarization stop layer, the leftover third portion of layers, and removes an upper portion of the remaining second portion of layers, wherein the second planarization process exposes the peripheral planarization film, and a process time of the second planarization process is controlled using an endpoint detection method corresponding to the remaining planarization stop layer.

20. The method of claim 16, wherein the peripheral structure includes a peripheral planarization stop film;

the stacked structure includes,
- a first portion of layers parallel to the first surface of the substrate,
- a second portion of layers extending from the first portion of layers in a direction parallel to the second surface of the substrate, and
- a third portion of layers extending from the second portion of layers to over a part of the peripheral planarization stop film,
   the third portion of layers exposing a part of the peripheral planarization stop film;

the planarization stop layer conformally covers the first to third portions of layers and the exposed part of the peripheral planarization stop film; and the planarizing the stacked structure includes,
   removing the planarization stop layer,
   removing the third portion of layers,
   partially removing the second portion of layers, and
   exposing the peripheral planarization stop film, wherein
      a process time of the planarizing the stacked structure is controlled using an endpoint detection method corresponding to the planarization stop layer.

* * * * *